(12) United States Patent
Kogawa et al.

(10) Patent No.: US 8,956,955 B2
(45) Date of Patent: Feb. 17, 2015

(54) MANUFACTURING METHOD OF SEMICONDUCTOR DEVICE AND SEMICONDUCTOR DEVICE

(75) Inventors: Shoetsu Kogawa, Nanae (JP); Satoru Nakayama, Nanae (JP); Seigo Kamata, Nanae (JP); Shigemitsu Seito, Nanae (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/612,348

(22) Filed: Sep. 12, 2012

(65) Prior Publication Data

US 2013/0017669 A1 Jan. 17, 2013

Related U.S. Application Data

(62) Division of application No. 12/978,944, filed on Dec. 27, 2010, now Pat. No. 8,298,919.

(30) Foreign Application Priority Data

Dec. 28, 2009 (JP) ................................ 2009-296749

(51) Int. Cl.
*H01L 21/78* (2006.01)
*H01L 21/304* (2006.01)
(Continued)

(52) U.S. Cl.
CPC .............. *H01L 21/304* (2013.01); *H01L 21/78* (2013.01); *H01L 23/585* (2013.01); *H01L 24/05* (2013.01);
(Continued)

(58) Field of Classification Search
USPC .......... 257/620, E21.599; 438/113, 459, 460, 438/462, 464
See application file for complete search history.

(56) References Cited

U.S. PATENT DOCUMENTS 6,261,883 B1 * 7/2001 Koubuchi et al. ............. 438/197
7,994,614 B2 8/2011 Tanaka et al.
(Continued)

FOREIGN PATENT DOCUMENTS

| CN | 101546736 (A) | 9/2009 |
| JP | 05-315304 A | 11/1993 |

(Continued)

OTHER PUBLICATIONS

Notification of the First Office Action dated Jan. 3, 2014 for Chinese Patent Application No. 201010607827.0, with English-language translation.

(Continued)

*Primary Examiner* — Peniel M Gumedzoe
(74) *Attorney, Agent, or Firm* — Miles & Stockbridge P.C.

(57) ABSTRACT

A method to prevent contamination of the principal surface side in a process of grinding the back surface side of a semiconductor wafer. At an intersection of a scribe region of a semiconductor wafer whose back surface side is to be ground, a plurality of insulating layers is laminated over the principal surface in the same manner as an insulating layer constituting a wiring layer laminated over a device region. Moreover, in the same layer as an uppermost wiring disposed at the uppermost layer among a plurality of the wiring layers formed for a device region, a metal pattern is formed. Furthermore, a second insulating layer covering the uppermost wiring is also formed over the metal pattern so as to cover the same.

11 Claims, 30 Drawing Sheets

(51) Int. Cl.
*H01L 23/58* (2006.01)
*H01L 23/00* (2006.01)

(52) U.S. Cl.
CPC ....... *H01L 24/06* (2013.01); *H01L 2224/02166* (2013.01); *H01L 2224/05014* (2013.01); *H01L 2224/05095* (2013.01); *H01L 2224/0616* (2013.01); *H01L 2924/01019* (2013.01)
USPC .................. 438/462; 257/620; 257/E21.599; 438/113; 438/459; 438/460; 438/464

(56) References Cited

U.S. PATENT DOCUMENTS

| | | |
|---|---|---|
| 2001/0035567 A1 | 11/2001 | Fujii |
| 2003/0080422 A1 | 5/2003 | Ohara |
| 2004/0097054 A1* | 5/2004 | Abe ............................. 438/460 |
| 2004/0150070 A1 | 8/2004 | Okada et al. |
| 2004/0212047 A1* | 10/2004 | Joshi et al. .................... 257/620 |
| 2004/0232517 A1 | 11/2004 | Furuhata |
| 2005/0026397 A1 | 2/2005 | Daubenspeck et al. |
| 2006/0076651 A1* | 4/2006 | Tsutsue ........................ 257/620 |
| 2008/0122039 A1 | 5/2008 | Liu |
| 2009/0108410 A1* | 4/2009 | Takemura et al. ............ 257/620 |
| 2009/0243044 A1* | 10/2009 | Tanaka et al. ................. 257/618 |

FOREIGN PATENT DOCUMENTS

| | | |
|---|---|---|
| JP | 2001-274129 A | 10/2001 |
| JP | 2003-203913 (A) | 7/2003 |
| JP | 2004-253678 A | 9/2004 |
| JP | 2005-228892 (A) | 8/2005 |
| JP | 2005-340423 (A) | 12/2005 |

OTHER PUBLICATIONS

Office Action (Notification of Reasons for Refusal) dated Sep. 16, 2014, in Japanese Patent Application No. 2013-223610.

* cited by examiner

P PART

MANUFACTURING METHOD OF SEMICONDUCTOR DEVICE AND SEMICONDUCTOR DEVICE

CROSS REFERENCE TO RELATED APPLICATIONS

This application is a division of application Ser. No. 12/978,944 filed Dec. 27, 2010 now U.S. Pat. No. 8,298,919. The disclosure of Japanese Patent Application No. 2009-296749 filed on Dec. 28, 2009 including the specification, drawings and abstract is also incorporated herewith by reference in its entirety.

BACKGROUND OF THE INVENTION

The present invention relates to a semiconductor device and a manufacturing technology thereof, in particular, to a technology that is effective when applied to a semiconductor device in which the thickness is reduced by grinding the back side of the semiconductor device.

As a technology for reducing the thickness of a semiconductor device, there is such a technology that, after forming an integrated circuit over the principal surface of a semiconductor wafer, the back side is ground.

For example, Japanese Patent Laid-Open No. 2004-253678 (Patent Document 1) describes the grinding of the back surface of a semiconductor wafer and, after that, the formation of a bank pattern made of polyimide resin for a part of a scribe line to be cut off. The Patent Document 1 describes that the infiltration of a grinding fluid into a gap between a surface protective tape and the scribe line can be prevented at the grinding of the back surface of the semiconductor wafer.

Moreover, for example, Japanese Patent Laid-Open No. 1993-315304 (Patent Document 2) describes the formation of a polyimide film uniformly for the peripheral part of a wafer. The Patent Document 2 describes that the adhesiveness between the wafer and the protective sheet is improved to make it possible to prevent the penetration of water, acid etc. to the wafer surface.

Moreover, for example, Japanese Patent Laid-Open No. 2001-274129 (Patent Document 3) describes the formation of a bank made of polyimide resin near intersections of scribe lines running in a lattice shape. The Patent Document 3 describes that it can prevent the penetration of grinding waste through a concave part with no polyimide film at the outer periphery of the wafer in the process of grinding the back surface.

SUMMARY OF THE INVENTION

A semiconductor device is manufactured by a method of forming integrated circuits by film formation, photolithography, etching, doping etc. for a semiconductor wafer made of, for example, a silicon single crystal, and, furthermore, by dicing the semiconductor wafer to give a plurality of semiconductor devices (semiconductor chips) from one semiconductor wafer.

Recent developments in the making electronic devices, in which a semiconductor device is mounted, lighter, thinner, shorter and smaller, also for a semiconductor device (a semiconductor chip or a semiconductor package in which a semiconductor chip is mounted), techniques have advanced to make the device thinner (reduction of the thickness) and smaller (reduction of planar dimension).

As a technology for making semiconductor devices thinner, a manufacturing method, in which integrated circuits are formed on the principal surface side of a semiconductor wafer and, after that, the back surface side thereof is ground and, further after that, dicing is carried out, is effective from the standpoint of securing the thickness of the semiconductor wafer necessary from the standpoint of stably forming the integrated circuit, and, at the same time, achieving the reduction of the thickness of the semiconductor chip. In this method, in a BG (Back Grind) process of grinding the back surface side of a semiconductor wafer, the grinding is carried out in a state where a protective sheet is stuck onto the principal surface side over which integrated circuits are formed, while supplying a grinding fluid.

However, the surface on the principal surface side of the semiconductor wafer is not a uniformly flat surface, but has roughness following wirings and terminals formed over the principal surface. Therefore, there occurs such a problem that foreign materials such as grinding waste generated by grinding the back surface side of the semiconductor wafer penetrate toward the principal surface side with the grinding fluid from the gap between the protective sheet and the semiconductor wafer. In particular, scribe regions arranged between each of a plurality of device regions forming the integrated circuit are in a depressed state as compared with convex parts of the device region to result in the occurrence of a gap between the scribe region and the protective sheet, and the gap works as a penetration route for foreign materials accompanied with the grinding fluid. When the grinding fluid with foreign materials penetrates into the principal surface side where the integrated circuit has been formed, it causes the contamination of the device region. It would be advantageous to prevent such contamination.

When the bank pattern or the bank made of polyimide resin is arranged in the scribe region for preventing the penetration of the grinding fluid as described in Patent Documents 1 to 3, the bank pattern or the bank made of polyimide resin is, accordingly, cut by a dicing blade in a dicing process after the grinding. The polyimide resin has a low hardness, however, and so a new problem occurs that abrasive grains used for the grinding in a state of being stuck fast to the cutting blade of dicing blade are not renewed by new abrasive grains to generate dicing failure.

Moreover, when the planar dimension of the semiconductor chip is made smaller, the number of semiconductor chips obtained from one semiconductor wafer increases. Therefore, consequently, the number of lines (number of dicing lines, number of scribe lines), along which the dicing blade is run for cutting one semiconductor wafer, has increased. Accordingly, when the frequency of damage of the dicing blade increases, the manufacturing efficiency lowers because the frequency of such a work as blade replacement increases. Moreover, the damage of the dicing blade occurring in the cutting work causes the occurrence of the dicing failure.

The present invention provides the improvement of reliability of such a semiconductor device.

The present invention also provides a technology for preventing or suppressing the contamination of the principal surface side in the process of grinding the back surface side of the semiconductor wafer.

The present invention further provides a technology capable of suppressing the dicing failure in the process of cutting the semiconductor wafer.

Other purposes and features of the present invention are made clear from the description of the present specification and the accompanying drawings.

The following explains briefly the outline of at least one of several embodiments disclosed in the present specification.

That is, for example, in the manufacturing method of a semiconductor device being an embodiment of the present invention, a plurality of first insulating layers is laminated over a part of a scribe region of the semiconductor wafer. Moreover, a metal pattern in the same layer as an uppermost wiring layer formed in a device region is formed. Furthermore, a second insulating layer covering the uppermost wiring layer is formed so as to cover also the upper surface of the metal pattern.

The following explains briefly an effect provided by at least one of several embodiments of the invention among those disclosed in the present application.

That is, for example, according to an embodiment of the present invention, the reliability of semiconductor devices can be improved.

DETAILED DESCRIPTION

In the present application, embodiments are described, divided into plural sections etc. if necessary for convenience. Except for the case where it is clearly specified in particular to be otherwise, they are not mutually independent and discrete, but, independently from the context of the description, they are respective parts of a single example, details of a part, or a modified example of a part or the whole of another embodiment, etc. As a principle, the repeated explanation of the same part is omitted. Respective elements in the embodiments are not indispensable, except for cases where it is clearly specified in particular to be otherwise. In respective drawings of embodiments, the same or similar parts are shown by the same or similar symbols or reference numbers, and the explanation is not repeated as a principle.

In accompanying drawings, hatching etc. may be omitted even for a cross-section, in a case where it gives a more complicated state, or the difference from a void is distinct. In contrast, hatching may be given even not to a cross-section, in order to show clearly that it is not a void.

Embodiment 1

Structure of a Semiconductor Chip (Semiconductor Device)

Figure 1:
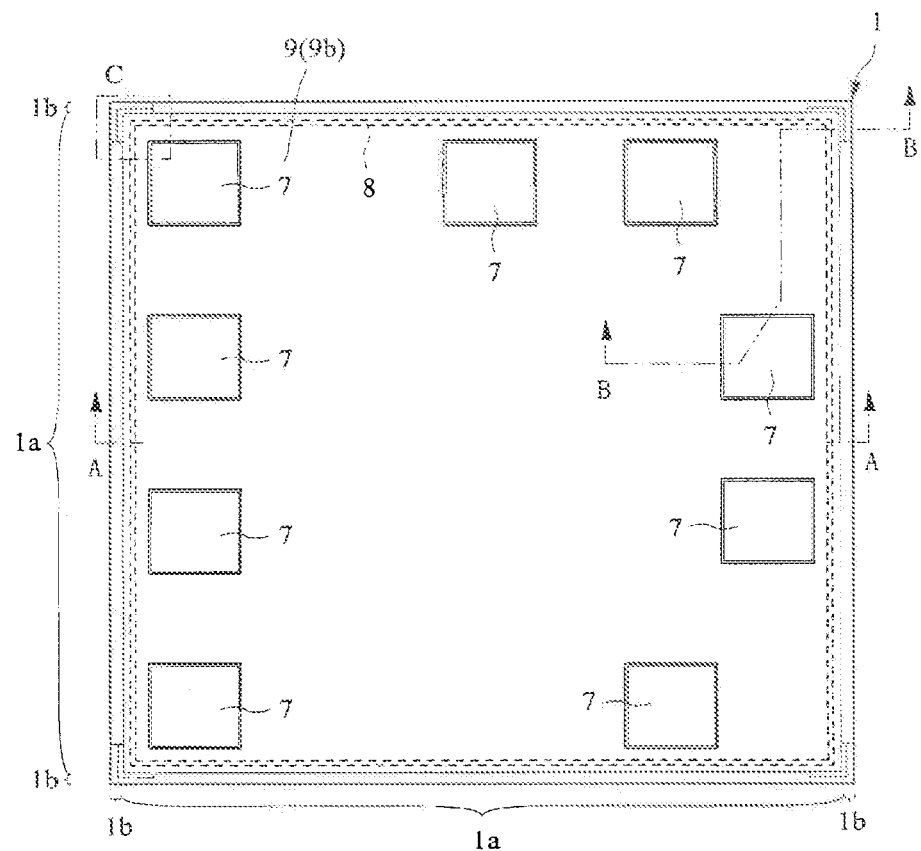
FIG. 1 is a plan view showing the principal surface side of a semiconductor device of an embodiment of the present invention.
Figure 2:
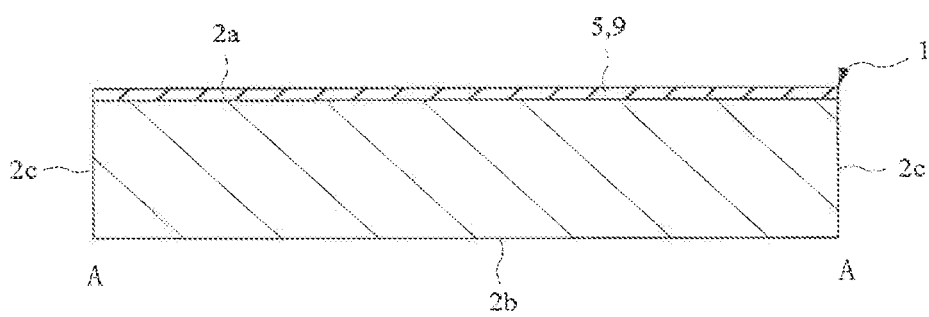
FIG. 2 is a cross-sectional view along the A-A line in FIG. 1.
Figure 3:
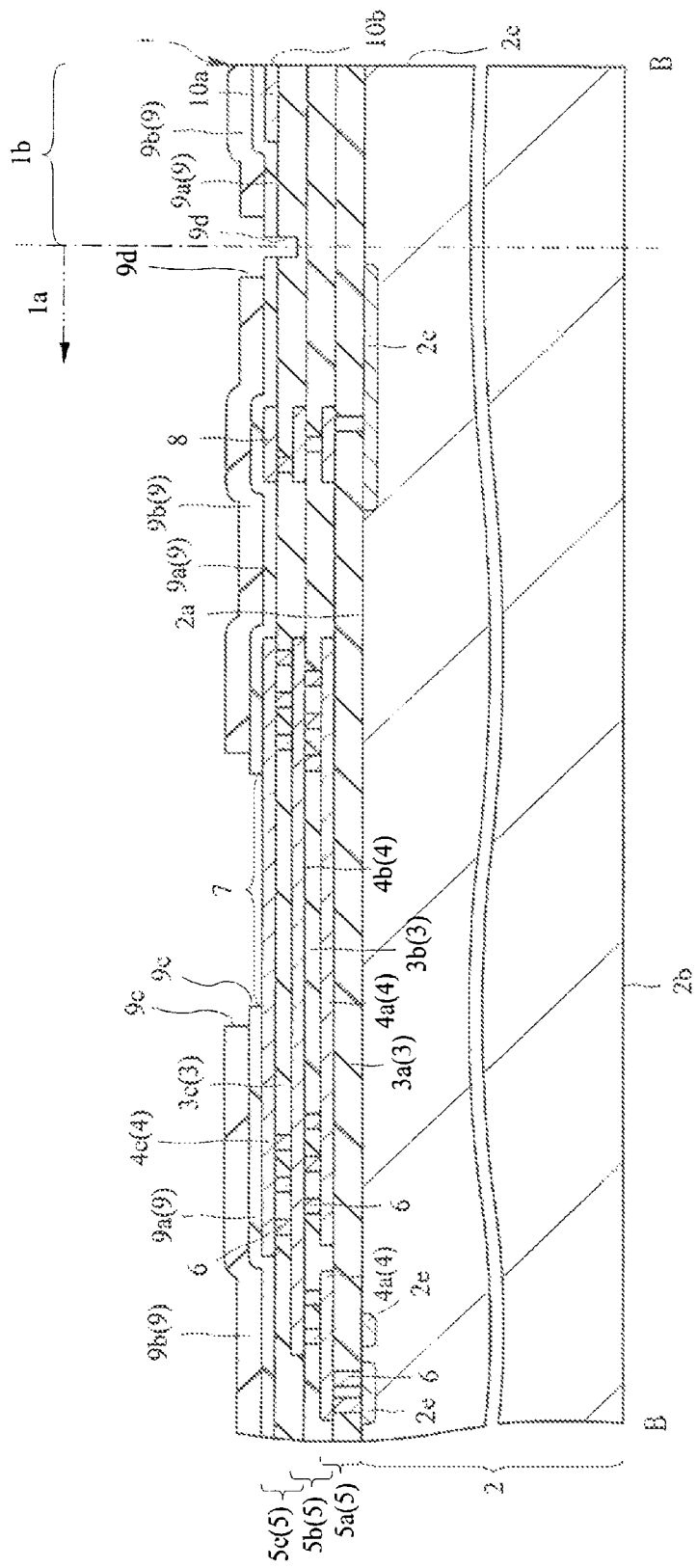
FIG. 3 is an enlarged cross-sectional view along the B-B line in FIG. 1.
Figure 4:
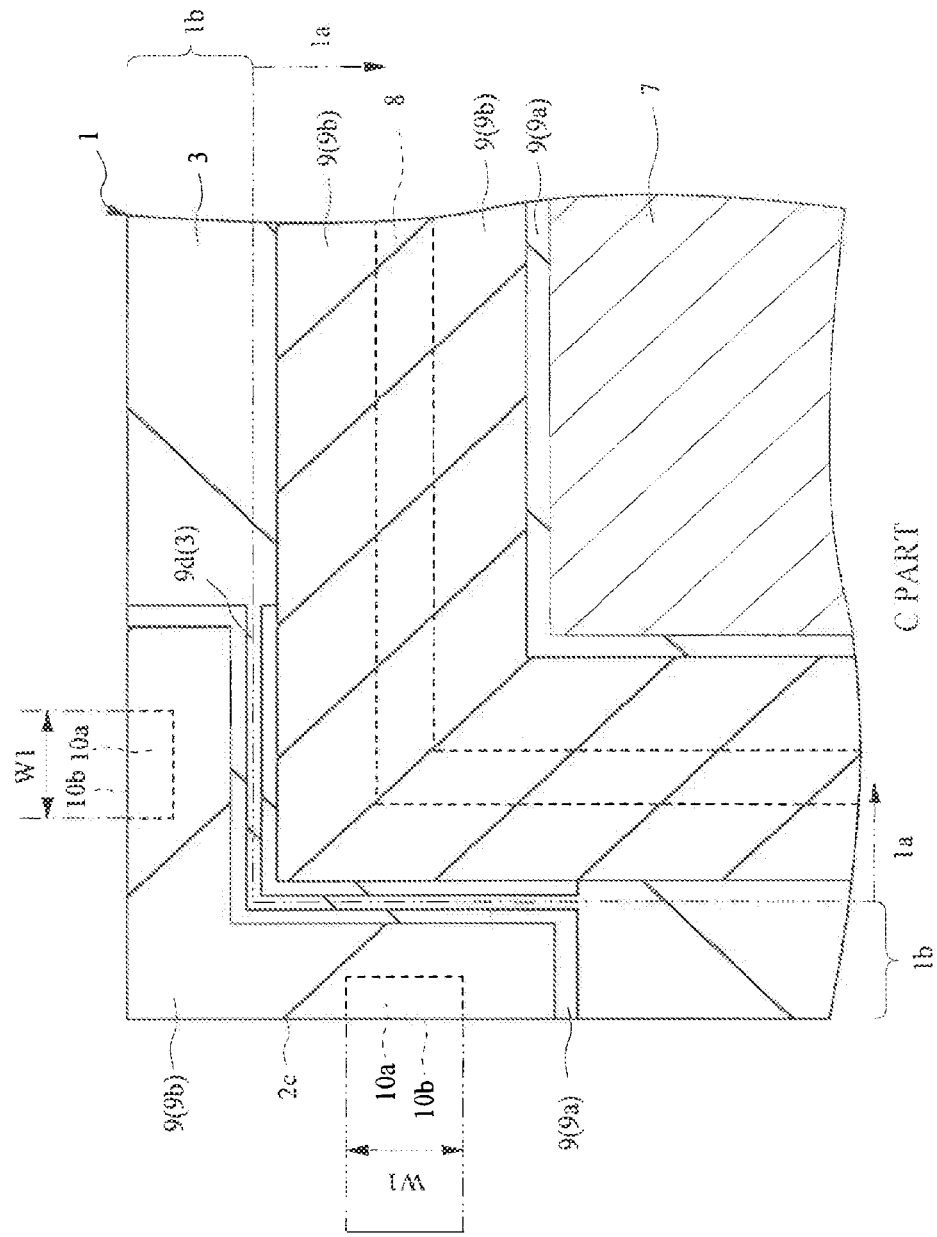
FIG. 4 is an enlarged plan view of the C part in FIG. 1.

First, the structure of a semiconductor chip (semiconductor device) according to Embodiment 1 will be explained. FIG. 1 is a plan view showing the principal surface side of a semiconductor chip being a semiconductor device in Embodiment 1. FIG. 2 is a cross-sectional view along the A-A line in FIG. 1, and FIG. 3 is an enlarged cross-sectional view along the B-B line in FIG. 1. FIG. 4 is an enlarged plan view of the C part in FIG. 1. FIGS. 1 and 2 are the plan view and the cross-sectional view respectively showing the overall structure of the semiconductor chip, and the detailed structure of the semiconductor chip is explained using FIGS. 3 and 4, which are enlarged drawings thereof, respectively. Meanwhile, FIG. 4 is a plan view, but hatching is given to make it easy to understand the planar shape of respective insulating layers laminated on the principal surface side, metal patterns etc.

A semiconductor chip (semiconductor device) 1 of Embodiment 1 shown in FIGS. 1 to 4 includes a semiconductor substrate 2 having a principal surface 2a, a back surface 2b lying on the opposite side of the principal surface 2a, and side surfaces 2c located between the principal surface 2a and the back surface 2b. The semiconductor substrate 2 contains, for example, silicon, and, for the principal surface 2a, for example, a plurality of semiconductor elements 2e (see FIG. 3) such as a transistor and a diode is formed. The planar shape of the principal surface 2a of the semiconductor chip 1 is a tetragon, and, in Embodiment 1, it is a regular square having a side length of, for example, 700 μm. Moreover, the thin thickness is achieved in the semiconductor chip 1 by grinding the back surface 2b side, and, in Embodiment 1, the thickness is, for example, 240 μm.

Over the principal surface 2a of the semiconductor chip 1, a plurality of wiring layers 5, each of which includes an insulating layer (insulating film) 3 and a plurality of wirings 4, are laminated. In Embodiment 1, as shown in FIG. 3, a three-layer structure is adopted, which includes a first wiring layer 5a, a second wiring layer 5b, and a third wiring layer (the uppermost wiring layer) 5c laminated in this order from the principal surface 2a side. Accordingly, in Embodiment 1, the third wiring layer 5c constitutes the uppermost wiring layer 5.

The insulating layer 3 constituting each of the wiring layers 5 includes, for example, a semiconductor oxide film such as silicon oxide ($SiO_2$). In more detail, the first insulating layer (insulating film) 3a constituting the wiring layer 5a is a BPSG (Boron Phosphor Silicate Glass) film formed by adding boron (B) and phosphorous (P) to $SiO_2$. Further, each of the second and third insulating layers 3b and 3c, which constitute wiring layers 5b and 5c respectively, is a PTEOS film being a silicon oxide ($SiO_2$) film formed by supplying TEOS (Tetraethylorthosilicate) as a reaction gas with a plasma CVD (Chemical Vapor Deposition) apparatus.

Each of the wirings 4 constituting respective wiring layers 5 is made of Al—Cu—Si containing aluminum (Al), copper (Cu) and silicon (Si). Furthermore, over the surface of the wiring 4, a plated film (not shown) is formed. In Embodiment 1, for example, a titanium (Ti) film, a titanium nitride (TiN) film, or a laminated film thereof is formed. In Embodiment 1, the wiring layer 5 has such a structure that a plurality of wirings 4 is formed over the insulating layer 3. The wiring 4 includes a wiring 4a of a first layer, a wiring 4b of a second layer, and a wiring (uppermost layer wiring) 4c of a third layer (uppermost layer), and, for each of the wiring layers 5, a plurality of wirings 4 is formed, respectively. The wiring 4 formed over the insulating layer 3 is electrically coupled with the wiring layer 5 lying in the under layer and the semiconductor element 2e over the principal surface 2a, via a via (wiring) 6 being an interlayer electroconductive path formed so as to pass through respective insulating layers 3 in respective insulating layers 3. The via 6 contains, for example, tungsten (W), and, for improving electric connection properties with the via 6, a plated film (not shown) such as a titanium film is also formed on the lower surface side of respective wirings 4.

Meanwhile, among a plurality of wiring layers 5, the wiring layers 5a and 5b may be wirings having a so-called damascene structure. That is, they may have a wiring structure formed by forming a trench in the insulating layer 3 and, after that, embedding an electroconductive film containing copper as the maim constituent into the trench. Moreover, they may have a dual damascene structure having a combined structure of the wiring layer 5a and the via 6.

Among the wiring layers 5, each of the plurality of wirings 4c formed for the wiring layer 5c disposed at the upper most layer is formed in combination with a plurality of pads (electrodes, terminals) 7 being external terminals of the semiconductor chip 1 to be electrically coupled with the pad 7. That is, the pads 7 shown in FIG. 1 are formed for the wiring layer 5c, respectively, shown in FIG. 3, and are electrically coupled with a plurality of semiconductor elements 2e via the wirings 4 (and the via 6). As to the planar arrangement of the pads 7, as shown in FIG. 1, they are arranged along respective sides of the semiconductor chip 1 having a tetragonal planar shape.

On the outer periphery of the region in which the pads 7 are arranged, a guard ring (metal pattern) 8 is formed. The guard ring 8 has a function of preventing the penetration into the inside of the guard ring 8 through the side surfaces 2c of the semiconductor chip 1, and is formed continuously surrounding the region in which the pads 7 are formed. Moreover, as shown in FIG. 3, the guard ring 8 is formed from the uppermost wiring layer 5c to the principal surface 2a, so as to pass through the respective wiring layers 5 (insulating layers 3). As described above, regions lying on and above the principal surface 2a of the semiconductor substrate 2 are surrounded by the guard ring 8 arranged on a further periphery part side spaced apart from the pads 7, and are prevented from the penetration of moisture into the inside. Meanwhile, in Embodiment 1, the guard ring 8 is electrically coupled with a semiconductor element 2e to which a reference potential is supplied, formed over the principal surface 2a.

Over the wiring layer 5c that is disposed for the uppermost layer among the wiring layers 5, an insulating layer 9 is formed, wherein the insulating layer 3c, the wiring 4c and the guard ring 8 are covered by the insulating layer 9. In Embodiment 1, the insulating layer 9 is an insulating layer (insulating film) having a laminated structure including an insulating layer 9a containing, for example, the above-described PTEOS film and an insulating layer 9b that is formed over the insulating layer 9a and contains, for example, silicon nitride (SiN).

In the insulating layer 9, a plurality of openings 9c is formed, respectively, at positions that overlap the pads 7, and the pad 7 is exposed from the insulating layer 9 at the opening 9c. In more detail, the opening 9c is formed in each of the insulating layers 9a and 9b, and the pad 7 is exposed from the laminated insulating layer 9.

The semiconductor chip 1 has a device region 1a, and a scribe region 1b that is arranged surrounding the circumference of the device region 1a in a planar view. The device region 1a is a region in which an electric circuit including the semiconductor element 2e, the wiring 4 electrically coupled with it, etc. is formed. The guard ring 8 is formed within the device region 1a along the outer periphery of the device region 1a having a tetragonal planar shape, for protecting the device region 1a in which the electric circuit is formed from the penetration of water.

On the other hand, the scribe region 1b is the remaining region of a cutting region defined when a plurality of the semiconductor chips 1 is obtained by dividing the semiconductor wafer into individual pieces in the process of manufacturing the semiconductor chip 1 to be described later. Therefore, in the scribe region 1b remaining in the semiconductor chip 1, wirings etc. electrically coupled with an electric circuit in the device region 1a are not formed.

Here, as shown in FIG. 3 or 4, at the corner of the scribe region 1b of the semiconductor chip 1, the insulating layer 3 of a plurality of layers (insulating layers 3a, 3b and 3c) is laminated as is the case for the inside of the device region 1a, and a metal pattern 10a is formed in the same layer as the wiring 4c. The upper surface of the metal pattern 10a (the face, surface lying on the opposite side of the surface facing the insulating layer 3c) is entirely covered with the insulating layer 9 containing the insulating layers 9a and 9b. The metal pattern 10a is exposed from the insulating layers 3 and 9 in the side surface 2c of the semiconductor chip 1. That is, the side surface 10b of the metal pattern 10a is exposed from the insulating layer 9. The metal pattern 10a is formed spaced apart from the guard ring 8, and is not electrically coupled with the guard ring 8. In Embodiment 1, two metal patterns 10a are formed at one corner. FIG. 4 is an enlarged plan view obtained by enlarging one corner of the semiconductor chip 1, and, for each of four corners of the semiconductor chip 1 shown in FIG. 1, two metal patterns 10a are formed.

These metal patterns 10a and the insulating layer 9 of the scribe region 1b covering the patterns remain after cutting a stopper (barrier, stopper part) 11 (see FIG. 9 to be explained later) for preventing or suppressing the contamination of the principal surface 2a side of the semiconductor chip 1 in the process of grinding the back surface in the process of manufacturing the semiconductor chip 1, which will be described later. The function and the detailed structure of the stopper 11 will be described in detail when the manufacturing method of the semiconductor chip 1 is explained.

At the boundary between the device region 1a and the scribe region 1b, the insulating layer 9 is removed, and the insulating layer 9 of the device region 1a is separated from the insulating layer 9 of the scribe region 1b. In other words, a trench 9d is formed between the insulating layer 9 of the device region 1a and the insulating layer 9 of the scribe region 1b, that is, they are formed spaced apart from each other. The reason is that, even when damage such as a crack occurs in the insulating layer 9 of the scribe region 1b in a dicing process in the process of manufacturing the semiconductor chip 1 to be described later, the extension of the damage into the device region 1a is to be prevented.

Figure 8:
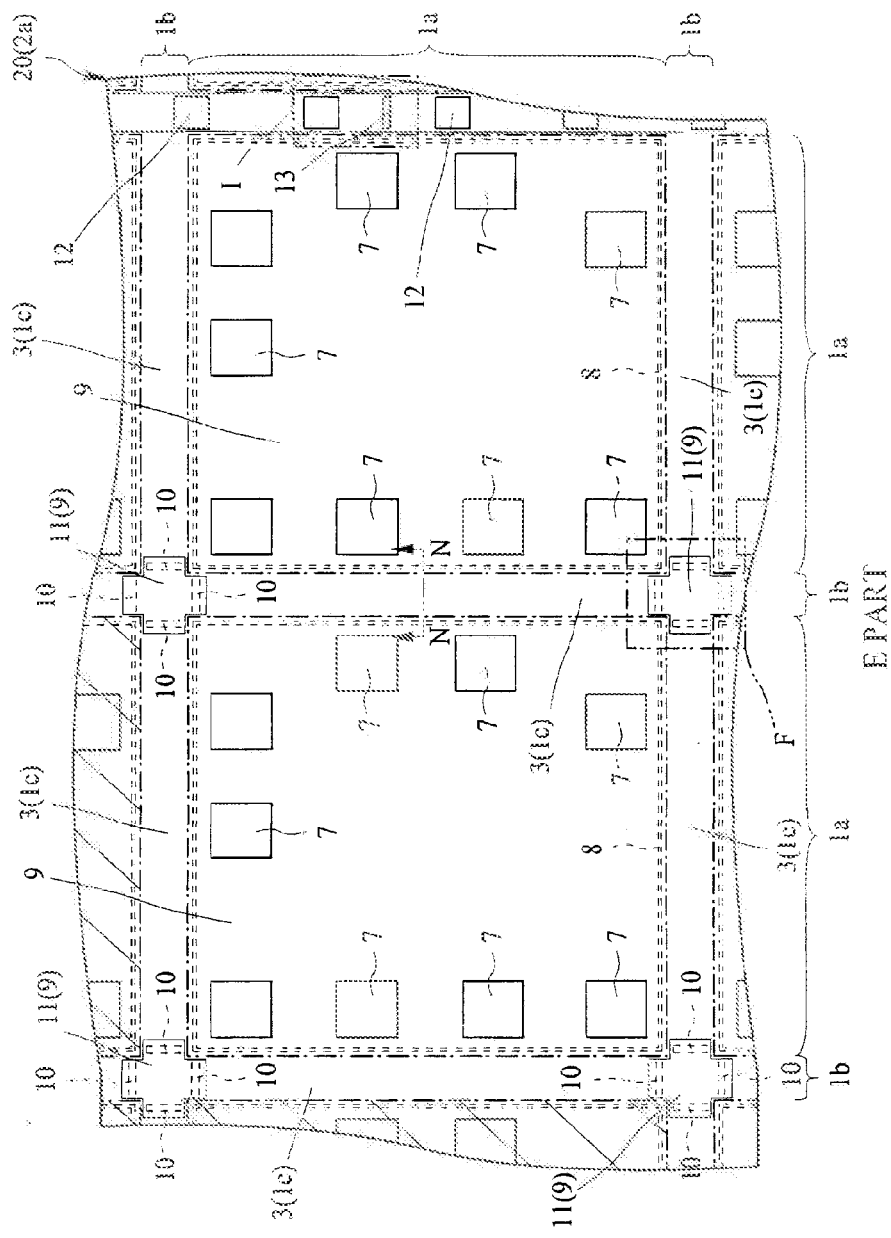
FIG. 8 is an enlarged plan view obtained by further enlarging the E part in FIG. 7.

In the side part between two corners of the scribe region 1b, a part of the insulating layer 3 of plural layers and the insulating layer 9 are removed to expose the insulating layer 3. That is, as shown in FIG. 8 to be explained in detail later, between intersections (the side part of the device region 1a) of the scribe regions 1b at which the stopper 11 is disposed, a trench (a depression, a concave part) 1c formed by removing a part of the insulating layer 9 and the insulating layer 3 is disposed. In scribe regions in which the stopper 11, a test pattern 12 or a fuse target 13 is not disposed, the trench 1c is disposed. As described above, by removing the insulating layer 3 and the insulating layer 9 in the scribe region 1b, the load on a dicing blade is reduced in a dicing process to be described later, to prevent or suppress the damage of the dicing blade. In Embodiment 1, such structure is adopted that the trench 1c is disposed to reduce the load on the dicing blade, and, consequently, the surface on the principal surface side of the semiconductor wafer is not uniformly flat. However, as described later, by providing the stopper 11, the contamination of the principal surface 2a side of the semiconductor chip 1 is prevented or suppressed in the process of grinding the back surface in the process of manufacturing the semiconductor chip 1.

Process of Manufacturing the Semiconductor Chip (Semiconductor Device)

Figure 5:
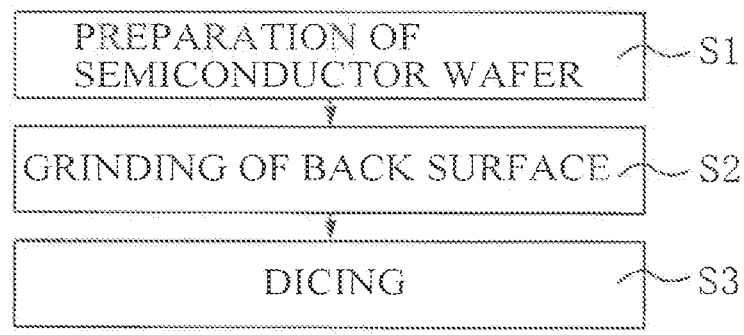
FIG. 5 is an explanatory view showing the flow of a manufacturing process of the semiconductor chip shown in FIGS. 1 to 4.

Next, the process of manufacturing the semiconductor chip 1 shown in FIGS. 1 to 4 will be explained. The semiconductor chip 1 in Embodiment 1 is manufactured along the flow shown in FIG. 5. FIG. 5 is an explanatory view showing the flow of the manufacturing process of the semiconductor chip shown in FIGS. 1 to 4. Details of respective processes will be explained below using FIGS. 6 to 23.

1. Process of Preparing a Semiconductor Wafer

Figure 6:
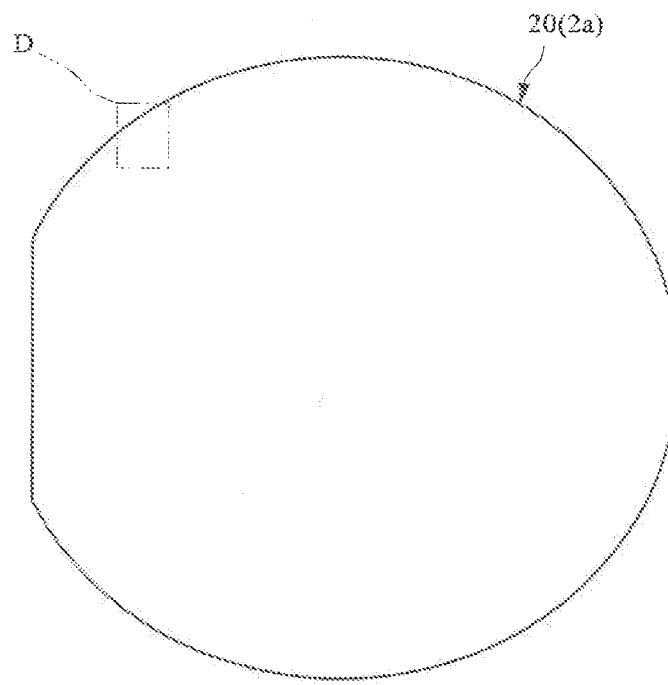
FIG. 6 is a plan view showing the overall structure of the principal surface side of the semiconductor wafer prepared in the process of preparing a semiconductor wafer shown in FIG. 5.
Figure 7:
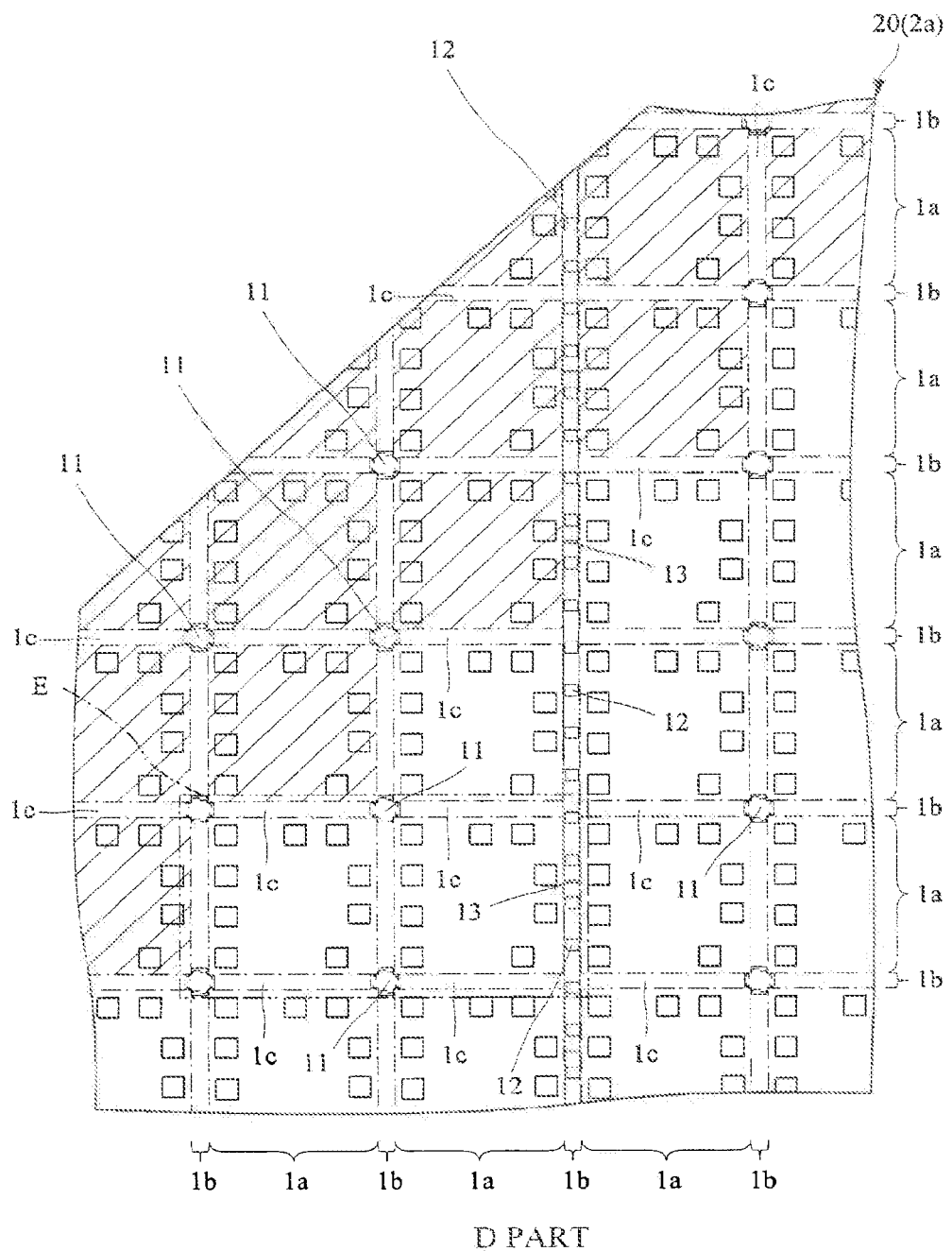
FIG. 7 is an enlarged plan view obtained by enlarging the D part in FIG. 6.
Figure 9:
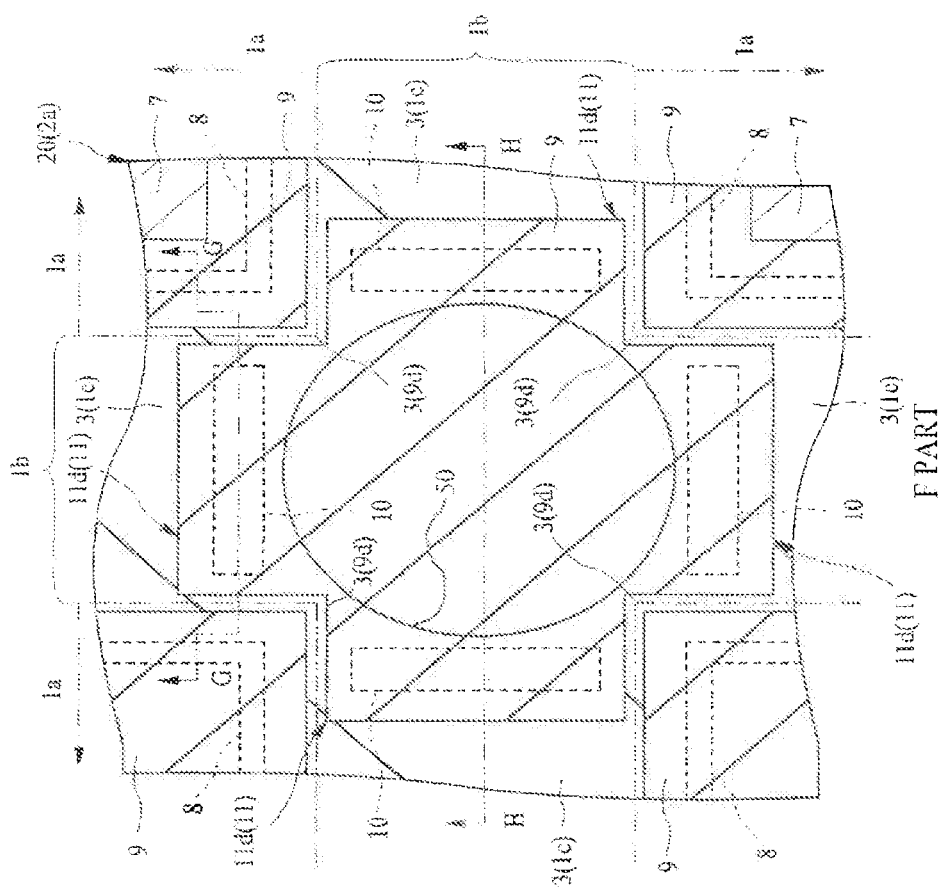
FIG. 9 is an enlarged plan view of the F part in FIG. 8.
Figure 10:
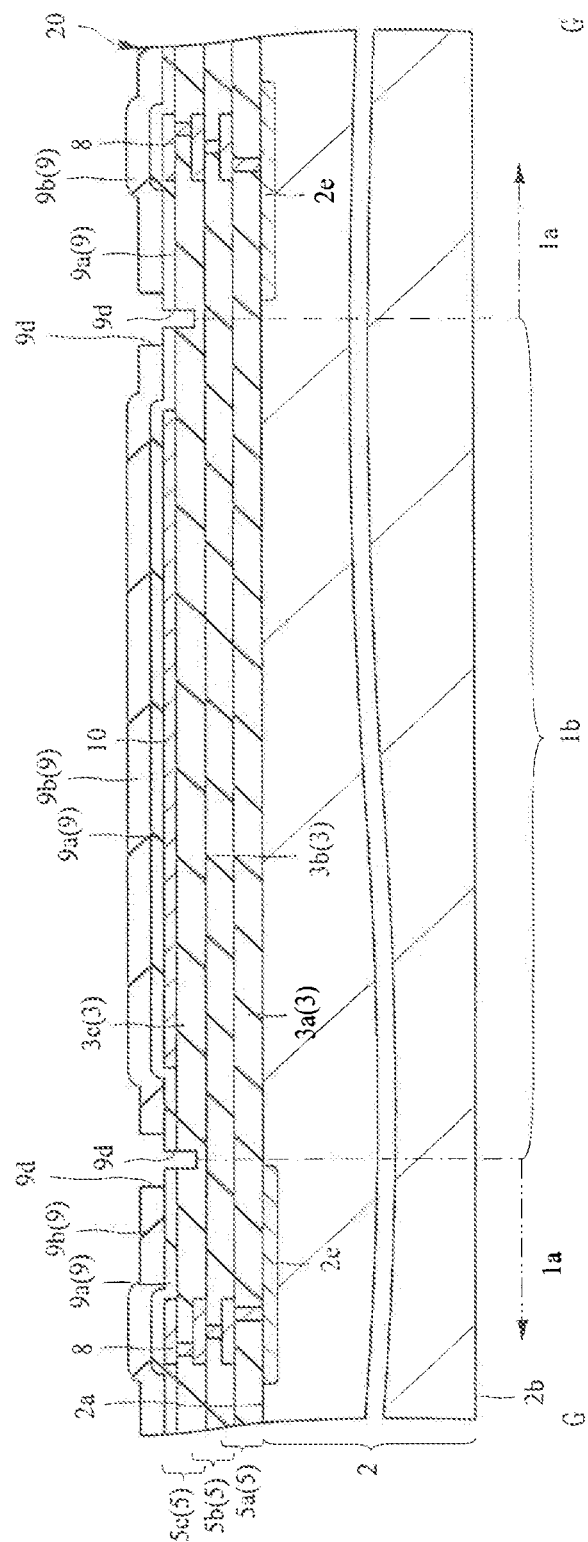
FIG. 10 is an enlarged cross-sectional view along the G-G line in FIG. 9.
Figure 11:
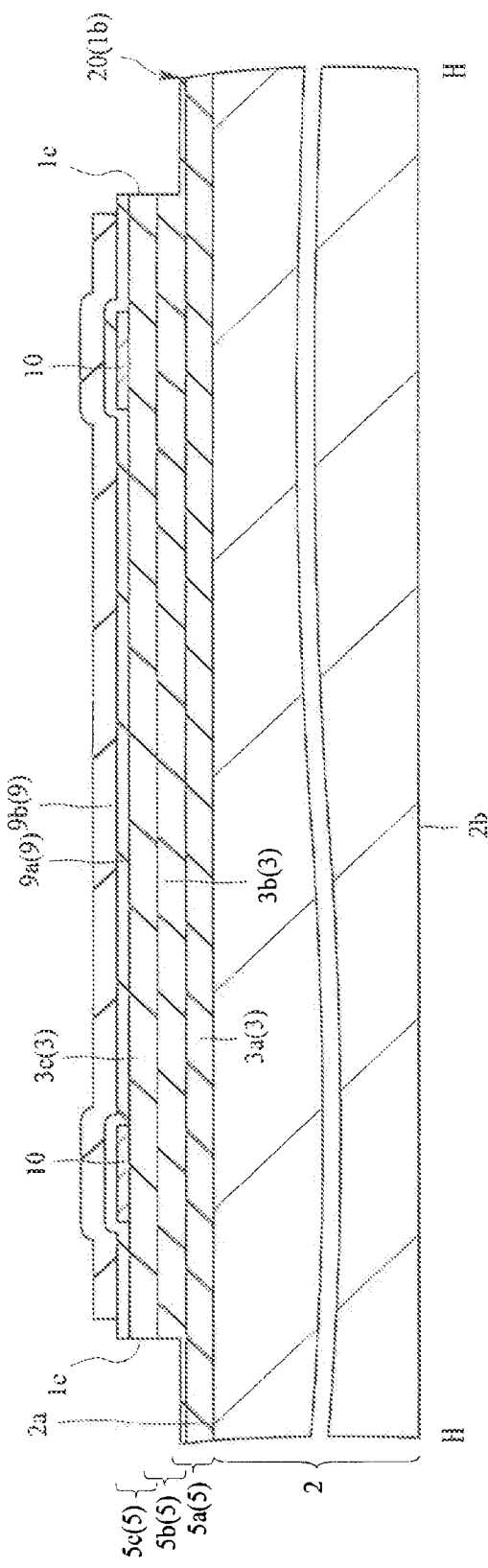
FIG. 11 is an enlarged cross-sectional view along the H-H line in FIG. 9.
Figure 12:
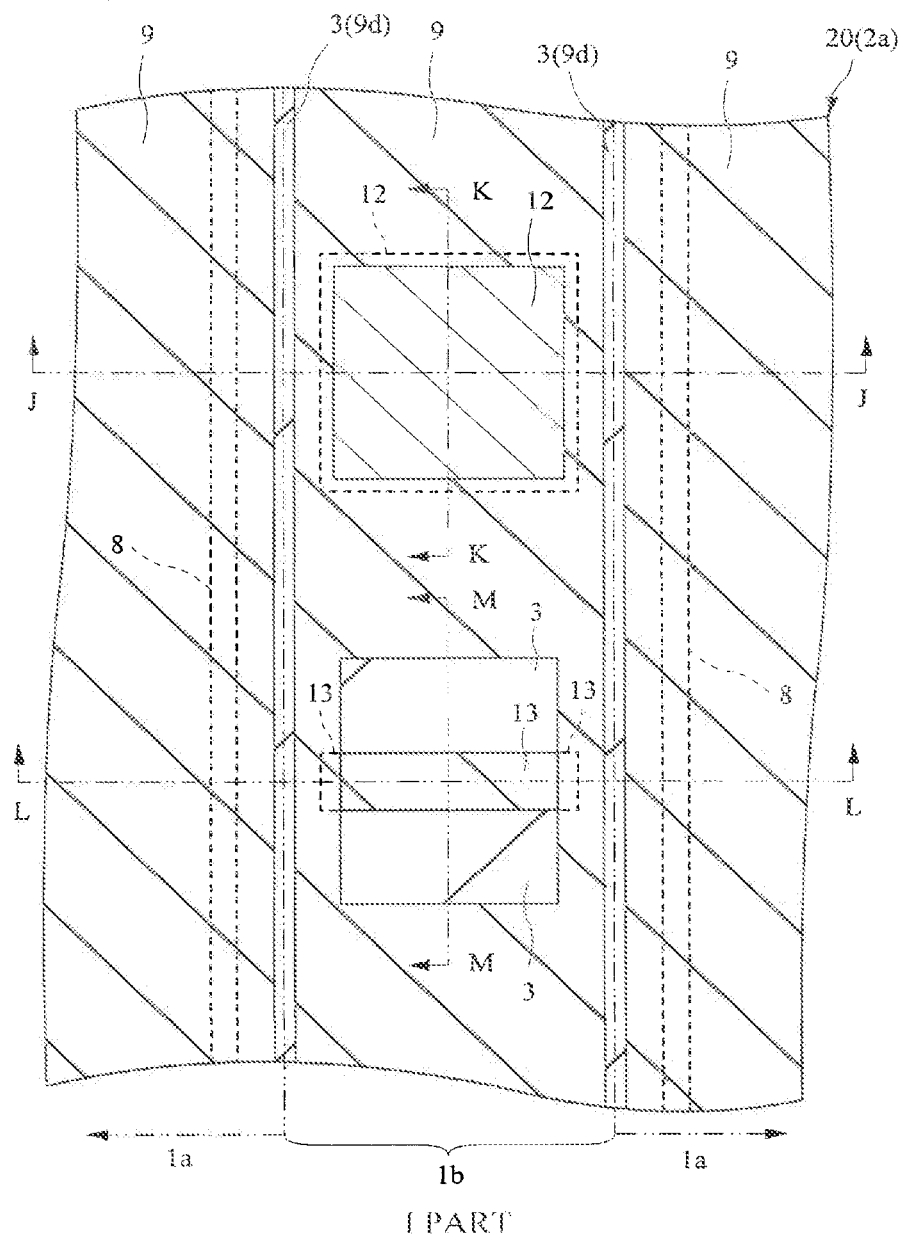
FIG. 12 is an enlarged plan view of the I part in FIG. 8.
Figure 16:
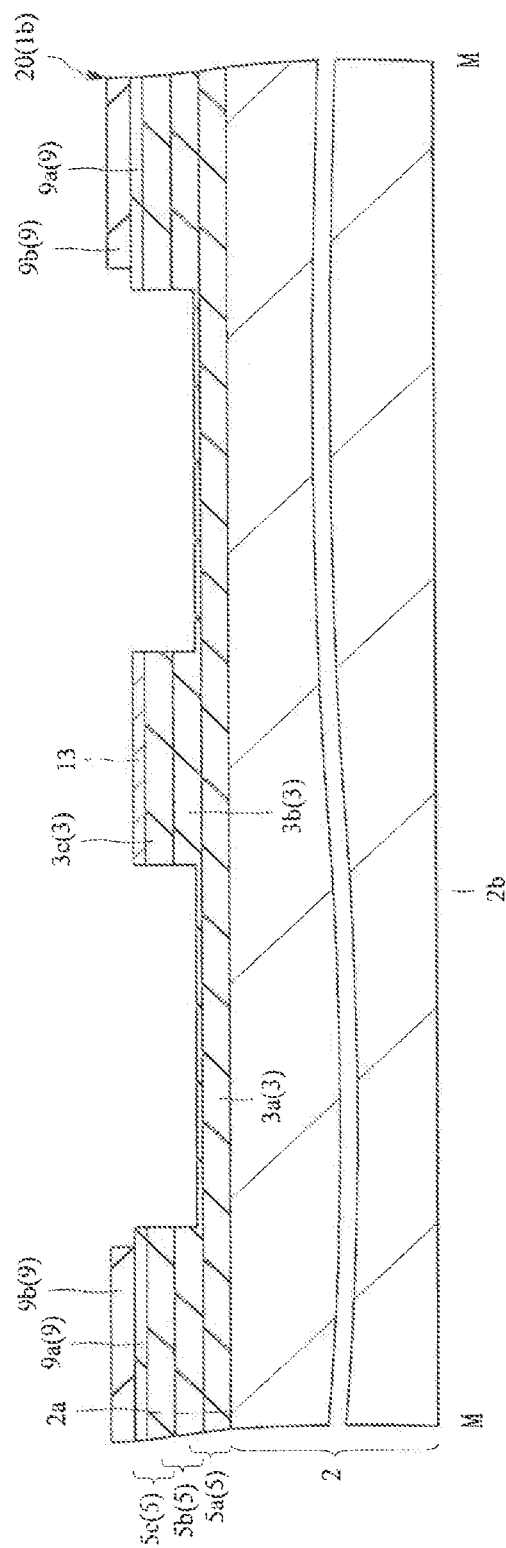
FIG. 16 is an enlarged cross-sectional view along the M-M line in FIG. 12.
Figure 17:
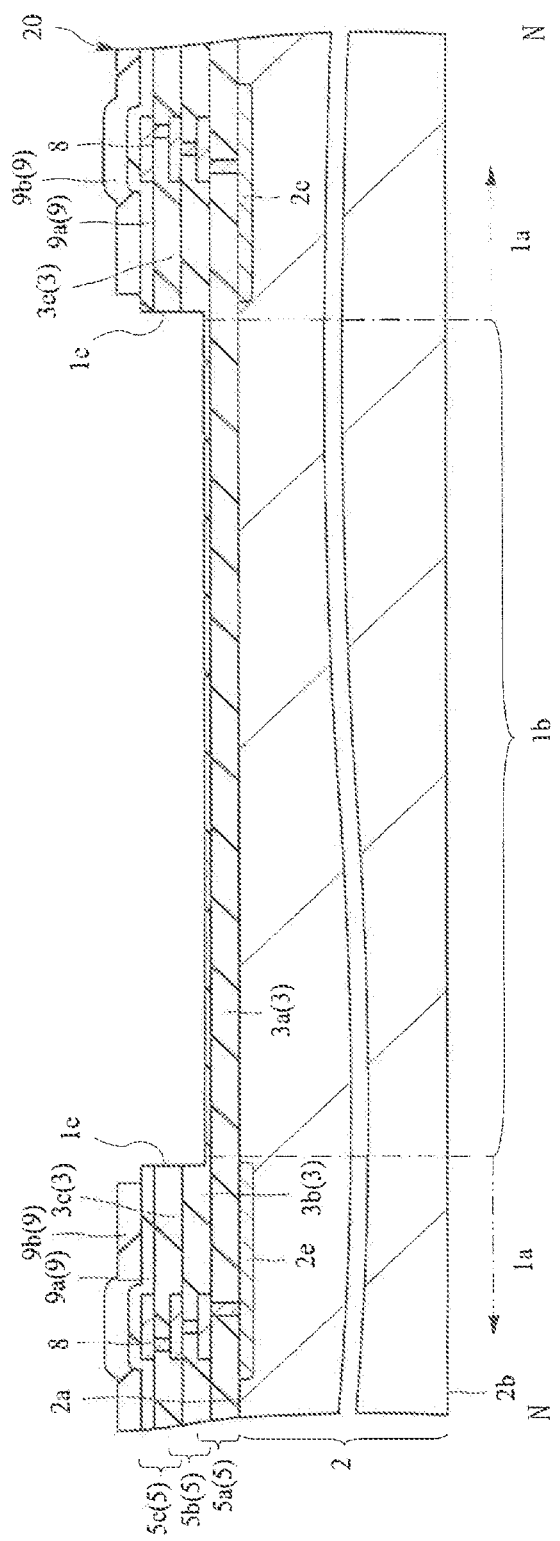
FIG. 17 is an enlarged cross-sectional view along the N-N line in FIG. 8.

First, as the process S1 of preparing a semiconductor wafer shown in FIG. 5, a semiconductor wafer 20 shown in FIGS. 6 to 17 is prepared. FIG. 6 is a plan view showing the overall structure of the principal surface side of a semiconductor wafer to be prepared in the process of preparing a semiconductor wafer shown in FIG. 5, FIG. 7 is an enlarged plan view obtained by enlarging the D part in FIG. 6, and FIG. 8 is an enlarged plan view obtained by further enlarging the E part in FIG. 7. FIG. 9 is an enlarged plan view of the F part in FIG. 8, FIGS. 10 and 11 are enlarged cross-sectional views along the G-G line and H-H line, respectively, in FIG. 9. FIG. 12 is an enlarged plan view of the I part in FIG. 8. FIGS. 13 to 16 are enlarged cross-sectional views along the J-J line, the K-K line, the L-L line and M-M line, respectively, in FIG. 12. FIG. 17 is an enlarged cross-sectional view along the N-N line in FIG. 8. Meanwhile, FIGS. 7 and 8 are plan views, but an ineffective chip region is hatched in order to make it easy to understand the distinction between the ineffective chip region and an effective chip region. Moreover, FIGS. 9 and 12 are also plan views, but in order to make it easy to understand the planar shapes of respective insulating layers, metal patterns, etc. to be laminated on the principal surface 2a side, hatching is given and the profiles of the guard ring 8, the metal pattern 10, the test pattern 12 and the fuse target 13 disposed under the insulating layer 9 are shown by a dotted line.

The semiconductor wafer 20 used in Embodiment 1 has the principal surface 2a, the back surface 2b (see FIG. 10) lying on the opposite side of the principal surface 2a, a plurality of device regions 1a formed on the principal surface 2a side, and the scribe region (scribe line) 1b arranged between the device regions 1a. As shown in FIG. 7, the device regions 1a are arranged in a matrix shape, and the scribe region 1b is arranged between each of these device regions 1a. Accordingly, the scribe region 1b has the planar shape of a lattice (a shape in which each of a plurality of scribe lines extends in a matrix shape). That is, the scribe region 1b has the scribe lines extending along a row direction (row scribe lines), and the scribe lines extending along a column direction (column scribe lines), wherein the row scribe line and the column scribe line intersect each other. On the other hand, the row scribe lines, or the column scribe lines do not intersect each other, but are arranged approximately in parallel. As described above, the device region 1a and the scribe region 1b are arranged regularly, and are formed up to the periphery of the principal surface 2a of the semiconductor wafer 20. Here, the semiconductor wafer 20 prepared in the present process has a larger thickness than the semiconductor chip 1 explained in FIGS. 1 to 4, because it is in a state not yet subjected to the process of grinding the back surface to be described later, and has a thickness of, for example, 550 μm.

In the process of forming such an integrated circuit as a semiconductor element for the semiconductor wafer 20, a large thickness of the semiconductor wafer 20 as described above enables the semiconductor wafer 20 to be handled without damage.

As shown, for example, in FIG. 8, in respective device regions 1a, there are formed a plurality of semiconductor elements 2e (see FIG. 3), the wiring layer 5 (see FIG. 3), a plurality of pads 7, the guard ring 8, the insulating layer 9 etc. that are explained using FIGS. 1 to 4. As described above, the device region 1a is formed regularly up to the periphery of the semiconductor wafer 20, but, in the periphery of the semiconductor wafer 20, a space for forming the device region 1a in a prescribed shape (tetragon in Embodiment 1) can not be obtained. Further, near the periphery of the semiconductor wafer 20, a failure may occur in a circuit to be formed. Accordingly, the periphery of the semiconductor wafer 20 is classified as an ineffective chip region (the device region 1a to which hatching is given in FIGS. 7 and 8), and the inside of the ineffective chip region (the center side of the semiconductor wafer 20) is classified as an effective chip region (the device region 1a to which hatching is not given in FIGS. 7 and 8). The semiconductor chip 1 shown in FIGS. 1 to 4 is acquired from the device region 1a that is the effective chip region. That is, the ineffective chip region is a region in which semiconductor elements and respective members are regularly formed as is the case for the effective chip region, but from which the acquisition of the semiconductor chip 1 is not expected.

On the other hand, in the scribe region 1b, for example, as shown in FIG. 10, the insulating layer 3 of plural layers (insulating layers 3a, 3b and 3c) is laminated as is the case for the inside of the device region 1a. At intersections (regions at which the scribe lines extending in the row direction and the scribe lines extending in the column direction intersect) in the scribe region 1b arranged in a lattice shape (a matrix shape), a stopper (a barrier, a stopper part) 11 is arranged. In other words, each of the stoppers 11 is disposed at the corner of respective device regions 1a of the semiconductor wafer 20. As shown in FIGS. 9, 10 and 11, at the intersection of the scribe regions 1b at which the stopper 11 is disposed, the metal pattern 10 is formed in the same layer as the wiring 4c (that is, over the insulating layer 3c). For each of the stoppers 11, a plurality of metal patterns 10 is formed (for example, four in FIG. 9), wherein respective metal patterns 10 each have a planar shape of a rectangle. Each of the metal patterns 10 is arranged so as to extend in a direction intersecting the extending direction of the scribe line. In other words, the short side of the metal pattern 10 is arranged along the extending direction of the scribe line.

As shown in FIG. 10, the metal pattern 10 is not electrically coupled to the guard ring 8 formed in the device region 1a. That is, the metal pattern 10 is formed spaced apart from the guard ring 8. In Embodiment 1, the guard ring 8 is electrically coupled with the semiconductor element 2e to which the reference potential is supplied. When the metal pattern 10 to be exposed from the side surface 2c (see FIG. 3) of the semiconductor chip 1 (see FIG. 3) after the dicing process to be described later is electrically coupled with the guard ring 8, it causes the occurrence of noise etc. in the semiconductor chip 1, which can lower the reliability of the semiconductor chip 1. For wiring layers 5a and 5b directly under the metal pattern 10, which differs from the guard ring 8, wiring and a metal pattern are not formed, and the metal pattern 10 has a floating structure that is not electrically coupled to the semiconductor element 2e formed for the semiconductor substrate 2. Meanwhile, although a metal pattern may also be formed for the wiring layers 5a and 5b directly under the metal pattern 10, for the purpose of reducing a load on the dicing blade in the dicing process to be described later, it is preferable not to form a metal pattern for the wiring layers 5a and 5b as is the case for Embodiment 1.

Each of the metal patterns 10 is entirely covered by the insulating layer 9. In Embodiment 1, after forming the insulating layer 3c and before forming such metal layers as the wiring 4c (see FIG. 3), the pad 7 (see FIG. 3), the guard ring 8 (see FIG. 3), the metal pattern 10 for the wiring layer 5c, the upper surface side of the insulating layer 3c is subjected to a grinding treatment. In more detail, when laminating respective wiring layers 5, first, the insulating layer 3 is formed, and next, in the insulating layer 3, a through hole is formed, and, into the through hole, the via 6 (see FIG. 3) to be an interlayer electroconductive path is embedded. Subsequently, over the insulating layer 3, a metal layer is formed, which is etched, for example, via a mask pattern to form the wiring 4 (see FIG. 3). The operation is repeated sequentially, and after the formation of the via 6 in the insulating layer 3c being the uppermost layer and before the formation of the wiring 4c, the insulating layer 3c is polished by, for example, CMP (Chemical Mechanical Polishing) to flatten the surface.

On the other hand, the insulating layer 9 is formed by forming the metal layer of the uppermost layer (wiring layer 5c) into a prescribed pattern such as the wiring 4c by, for example, etching and, after that, being laminated over the wiring layer 5c, and is not subjected to a grinding treatment after the film forming. Therefore, the surface of the insulating layer 9 has less flatness than the surface of the insulating layer 3c, and has roughness that is formed according to the shape of the metal pattern 10 etc. In more detail, for example, as shown in FIG. 10, the insulating layer 9 over the guard ring 8 and the insulating layer 9 over the metal pattern 10 rise (have a convex shape) as compared with the surrounding insulating layers 9. In other words, over the guard ring 8, a convex part where the insulating layer 9 rises as compared to surrounding portions is formed. Moreover, in Embodiment 1, metal layers such as the wiring 4c (see FIG. 3), the pad 7 (see FIG. 3), the guard ring 8 (see FIG. 3) and the metal pattern 10 are formed collectively by, for example, a plating method. Consequently, the metal pattern 10 has the same thickness as the guard ring 8. Therefore, the height of the insulating layer over the metal pattern 10 is the same as the height of the insulating layer 9 over the guard ring 8. As described above, in regions where the metal pattern 10 is formed, the insulating layer 9 is formed in a convex shape as compared to surrounding portions. Therefore, in the process of grinding the back surface to be described later, it is possible to cause the protective sheet to be in close contact with the insulating layer 9.

Figure 13:
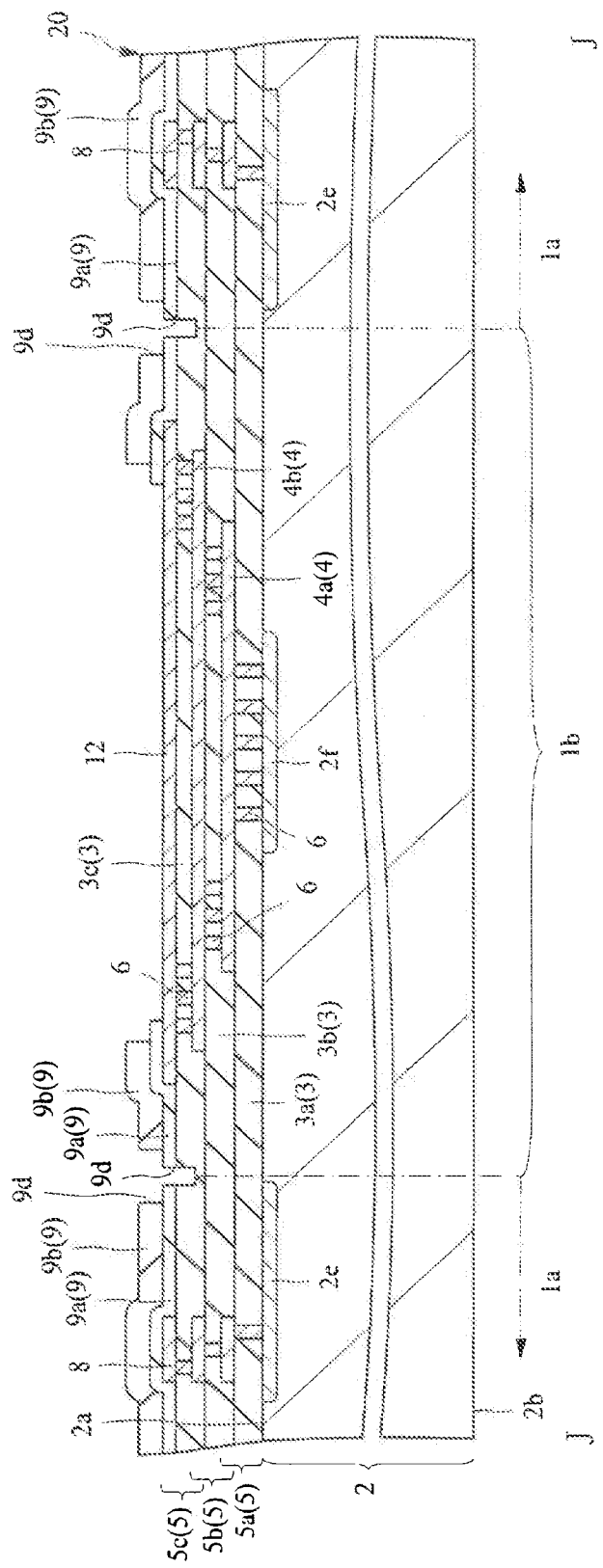
FIG. 13 is an enlarged cross-sectional view along the J-J line in FIG. 12.
Figure 14:
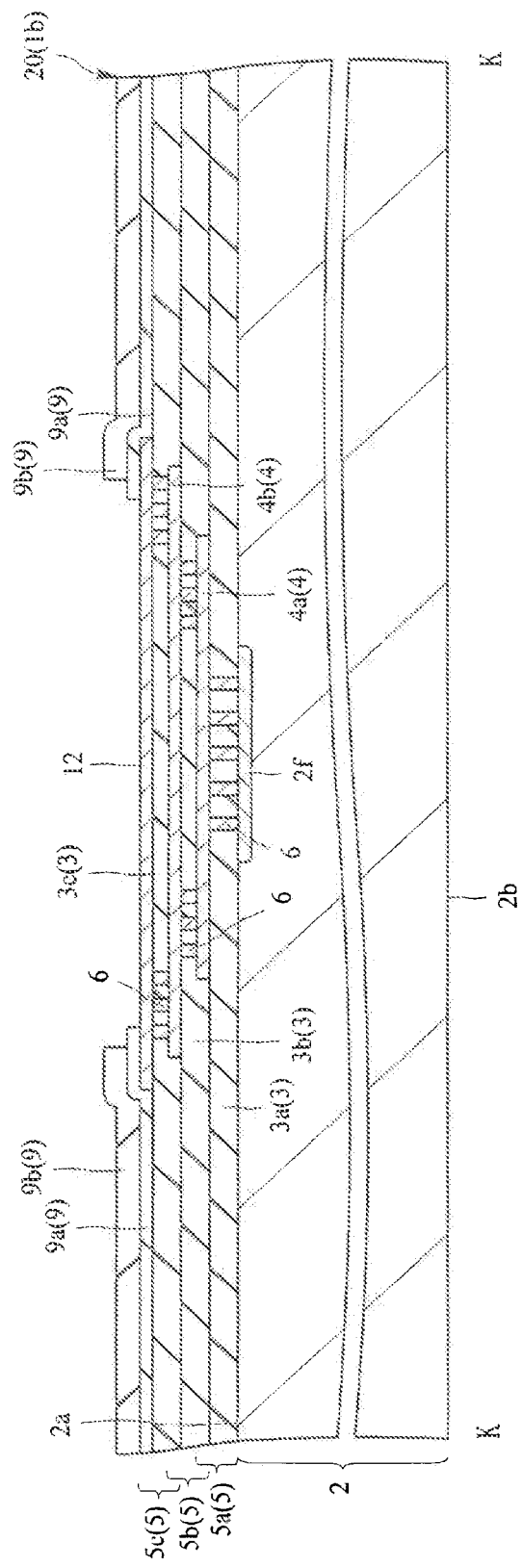
FIG. 14 is an enlarged cross-sectional view along the K-K line in FIG. 12.
Figure 15:
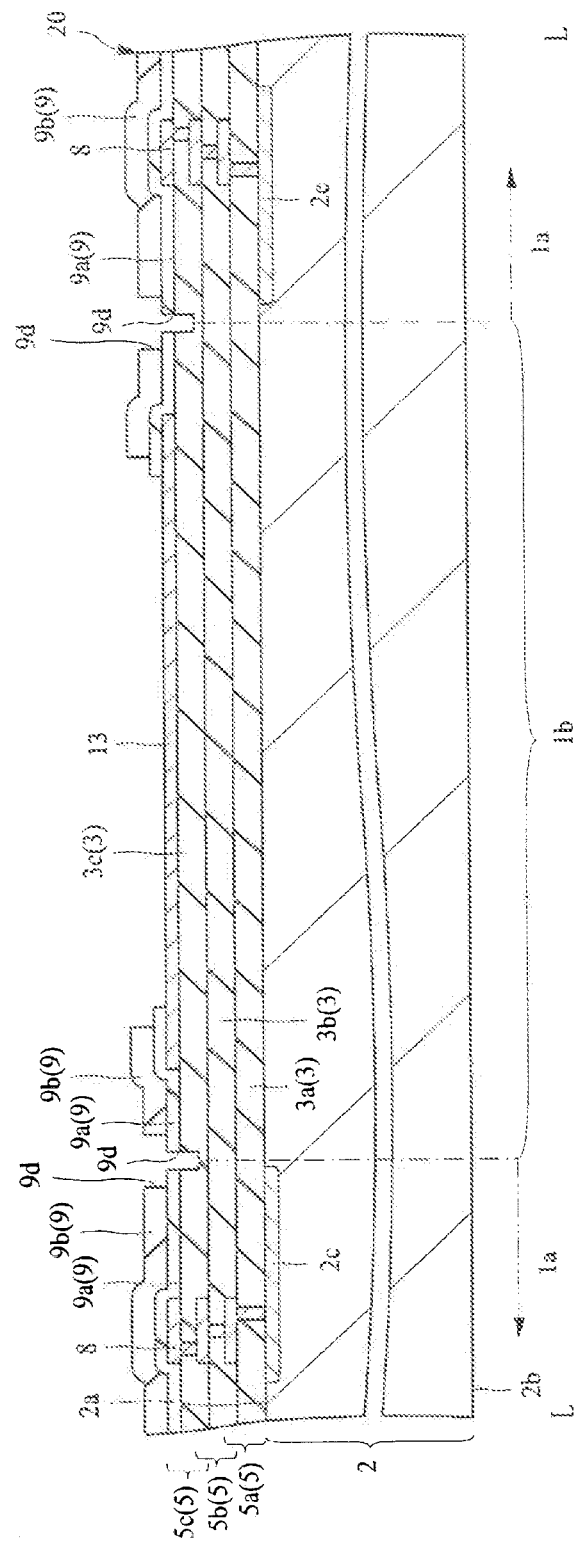
FIG. 15 is an enlarged cross-sectional view along the L-L line in FIG. 12.

In a part of the scribe region 1b, which is different from the intersection at which the stopper 11 is disposed, plural test patterns 12 are arranged. In Embodiment 1, as shown in FIG. 7, the test patterns (metal patterns) 12 are arranged along the scribe line extending in the row direction. The test pattern 12 is a conductor pattern containing, for example, the same metal as that of the pad 7, and is a pattern for evaluating the semiconductor element 2e etc. formed for the semiconductor wafer 20 by an electric test prior to cutting the semiconductor wafer 20. As shown in FIGS. 12, 13 and 14, the test pattern 12 being a pattern for evaluation is electrically coupled with a semiconductor element 2f for evaluation referred to as a TEG (Test Element Group) formed over the principal surface of the semiconductor substrate 2. In more detail, the test pattern 12 formed for the wiring layer 5c is electrically coupled with the semiconductor element 2f formed over the principal surface 2a in the scribe region 1b, via the wirings 4b and 4a formed in the wiring layers 5b and 5a arranged under the wiring layer 5c and the via (wiring) 6. As to the test pattern 12 formed for the wiring layer 5c, at least a part thereof is exposed from the insulating layer 9 in the same layer as the pad 7 (see FIG. 3) and the wiring 4c (see FIG. 3). The reason is that the part exposed from the insulating layer 9 is used as an electrode when a test is carried out. In order to use the exposed part as the electrode, it is necessary to set the area of the test pattern 12 to be relatively large. Accordingly, the test pattern 12 has a larger area than the metal pattern 10. In other words, the metal pattern 10 is not a pattern used as an electrode, differing from the test pattern 12. Therefore, it has a smaller area than the test pattern 12. Meanwhile, the TEG may include the semiconductor element 2f and the test pattern 12 for the evaluation.

In still another part of the scribe region 1b, a mark (alignment mark) is formed, the mark being used for alignment when the semiconductor wafer 20 is subjected to processing after forming integrated circuits for the semiconductor wafer 20 and before cutting of the semiconductor wafer 20. FIGS. 8, 12, 15 and 16 show, as an example of the alignment mark, a fuse target (alignment mark, metal pattern) 13, which is an alignment mark used when cutting a fuse formed in the device region 1a. The fuse target 13 is a pattern containing, for example, the same metal as the pad 7 (in Embodiment 1, Al—Cu—Si), and is a pattern for carrying out the alignment utilizing the difference in the reflectivity from the surrounding insulating layer 3 or the insulating layer 9 when a fuse formed in the device region 1a (now shown) is to be cut. Accordingly, the whole or a part of the fuse target 13 is exposed from the insulating layer 9. Moreover, for the purpose of carrying out the alignment utilizing the difference in the reflectivity, it is preferable that the area exposed be as large as possible. Therefore, in Embodiment 1, as shown in FIGS. 12 and 16, openings are formed, in which the insulating layer 9 is removed so as to expose both ends of the long side of the fuse target 13.

As described above, for the wiring layer 5c for which the metal pattern 10 is formed, the test pattern 12 and the fuse target 13 are also formed, but the metal pattern 10 is different from these in that the entirety of metal pattern 10 is covered with the insulating layer 9 (in other words, metal pattern 10 is not exposed from the insulating layer 9).

The metal pattern 10 prevents or suppresses the contamination in the device region 1a due to the process of grinding the back surface to be described later. Although details will be described later, contamination sources penetrate along the scribe region (scribe line) 1b. Accordingly, it is preferable that the length of the metal pattern 10 in the direction of intersecting the scribe line (that is, the length of the long side) be as long as possible, and to block the width of the scribe line. On the other hand, even when the length of the metal pattern 10 in the direction along the scribe line (that is, the length of the short side) is made short, the pattern can prevent or suppress the contamination as the stopper. For suppressing the damage of the dicing blade in the dicing process to be described later, preferably obstacles in the scribe region 1b are as few as possible. Accordingly, in Embodiment 1, the length of the long side of the metal pattern 10 is not less than the length of the test pattern 12 and the fuse target 13 in the direction of intersecting the scribe line. The length of the short side of the metal pattern 10 is made shorter than the length of the test pattern 12 and the fuse target 13 in the direction along the scribe line.

In Embodiment 1, parts of the insulating layer 9 and the insulating layer 3 are removed from the portion between the intersections of the scribe regions 1b (the side part of the device region 1a) at which the stopper 11 is disposed. In other words, between the stoppers 11, the trench (depression, concave part) 1c formed by removing each part of the insulating layer 9 and insulating layer 3 is disposed. As described above, as to scribe regions in which the stopper 11, the test pattern 12 or the fuse target 13 is not disposed, by disposing the trench 1c, the load on the dicing blade can be reduced in the dicing process to be described later.

At the boundary between the device region 1a and the scribe region 1b, the insulating layer 9 of the device region 1a is separated from the insulating layer 9 of the scribe region 1b, because the trench 9d is formed between these insulating layers 9. Consequently, even when damage such as cracks occurs in the insulating layer 9 of the scribe region 1b in the dicing process to be described later, damage in the device region 1a can be prevented.

The trench 9d is formed as follows. First, after patterning metal patterns to be formed for the wiring layer 5c such as the wiring 4c, the pad 7, the guard ring 8 and the metal pattern 10, the insulating layer 9 is formed so as to cover the entire portions of these. In Embodiment 1, the insulating layers 9a and 9b are laminated sequentially in this order. Subsequently, the opening 9c shown in FIG. 3 is formed by etching. In such embodiments, a mask is arranged so as to cover the insulating layer 9 (not shown), in which through holes are formed in positions of the opening 9c and the trench 9d (the position overlapping the pad 7 and the position overlapping the boundary line of the device region 1a and the scribe region 1b). As a result, the trench 9d can be formed collectively with the opening 9c. By using a mask in which a through hole is also formed in the position overlapping the trench 1c shown in FIG. 11, the trench is can also be formed collectively with the opening 9c and the trench 9d.

Meanwhile, in Embodiment 1, when forming the opening 9c, the insulating layers 9b and 9a are removed sequentially by etching. After that, a plated film (Ti/TiN film, not shown) formed over the surface of the pad 7 is also removed by etching. When respective members laminated over the pad 7 are removed by etching as described above, if the same mask is used, then a part of the insulating layer 3 that also lies under the insulating layer 9a is removed by the etching in the trench 9d shown in FIG. 10 and the trench 1c shown in FIG. 11. Accordingly, for example, when etching the insulating layer 9b and, after that, replacing the mask by a mask in which no through hole is formed in a position overlapping the trench 9d (that is, covering the trench 9d) and further carrying out the etching, it is also possible to form the trench 9d selectively only in the insulating layer 9b. In this way, the depth of the trench 9d may be made to be shallower as compared to the embodiment discussed with respect to FIG. 10. In the dicing process to be described later, a crack can occur easily, in particular, in the insulating layer 9b disposed as the uppermost layer. Therefore, when at least the insulating layer 9b in the device region 1a is separated from the insulating layer 9b in the scribe region 1b, the development of the crack may be suppressed. But, for ensuring prevention of the development of the crack, it is more preferable to form the trench 9d that passes through the insulating layer 9a and the insulating layer 9b, as shown in FIG. 10.

As shown in FIG. 10, the opening width of the trench 9d formed in the insulating layer 9b is wider than the opening width of the trench 9d formed in the insulating layer 9a or the insulating layer 3. Because the trench 9d is formed at the same time that the opening 9c over the pad 7 is formed, an etching gas used when removing the titanium (Ti) film and the titanium nitride (TiN) film by anisotropic etching also etches the insulating layer 9b.

The depth of the trench 1c shown in FIG. 11 is deeper than the depth of the trench 9d shown in FIG. 10. The reason is that the horizontal area of the trench 1c is greater than the horizontal area of the trench 9d. That is, the opening area of the through hole of the mask for forming the trench 1c by etching is greater than the opening area of the through hole of the mask for forming the trench 9d. Consequently, the trench 1c is removed deeper than the trench 9d, and a part of the insulating layer 3b is also removed.

2. Process of Grinding the Back Surface

Figure 18:
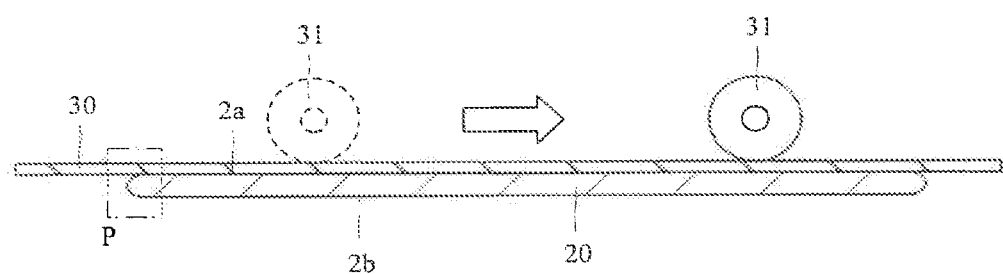
FIG. 18 is a cross-sectional view showing the state where a protective sheet is stuck on the principal surface side of the semiconductor wafer shown in FIG. 6.
Figure 19:
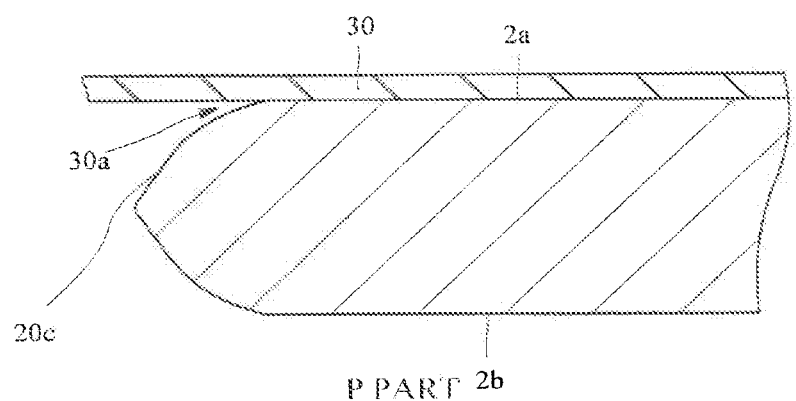
FIG. 19 is an enlarged cross-sectional view of the P part in FIG. 18.
Figure 20:
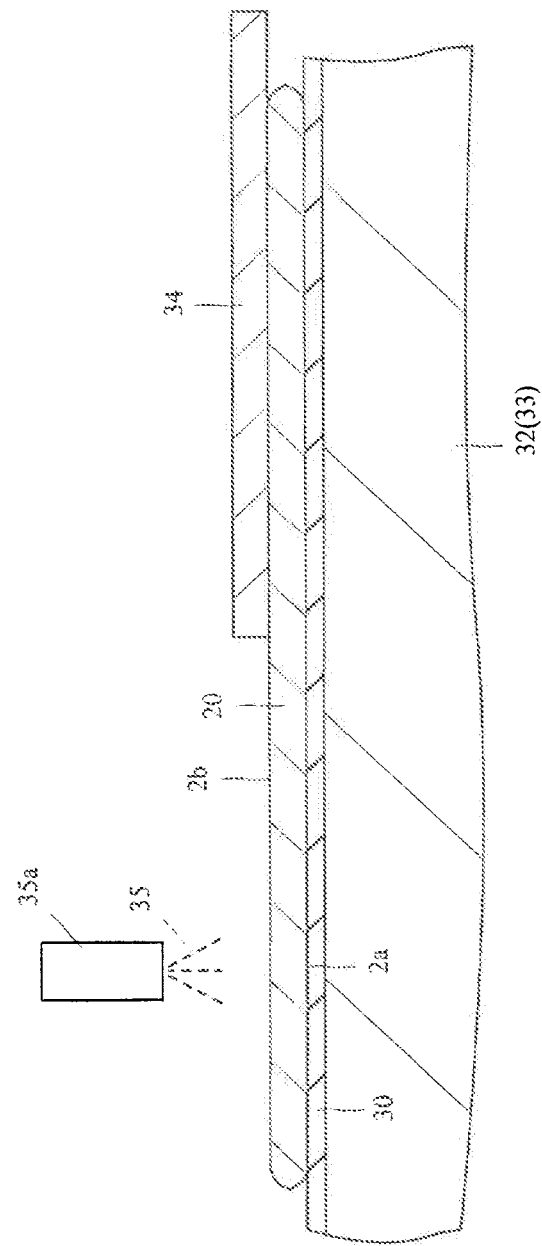
FIG. 20 is a cross-sectional view showing a process of grinding the back surface of the semiconductor wafer on which the protective sheet is stuck shown in FIG. 18.
Figure 21:
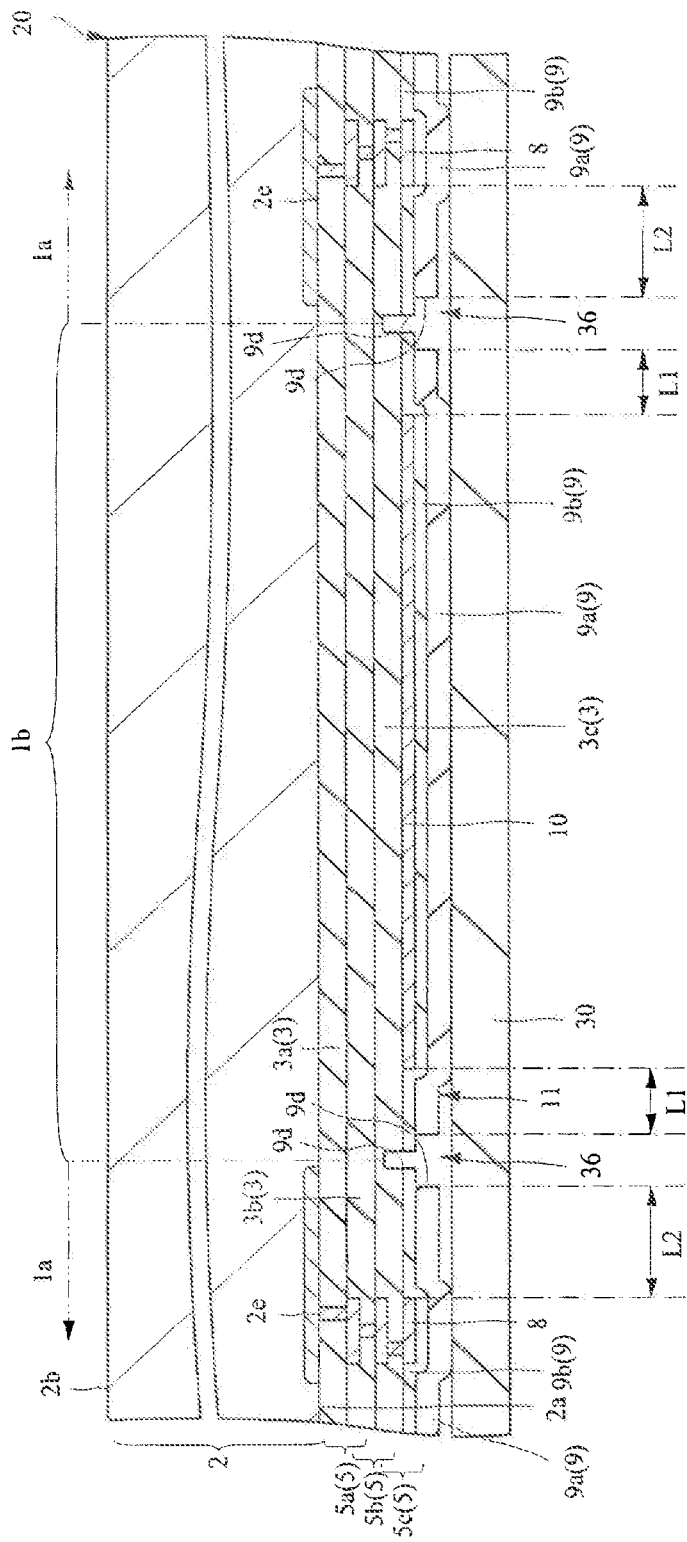
FIG. 21 is an enlarged cross-sectional view showing a state where the protective sheet is stuck on the surface of the principal surface side of the semiconductor wafer shown in FIG. 10 and, after that, the wafer is reversed.
Figure 31:
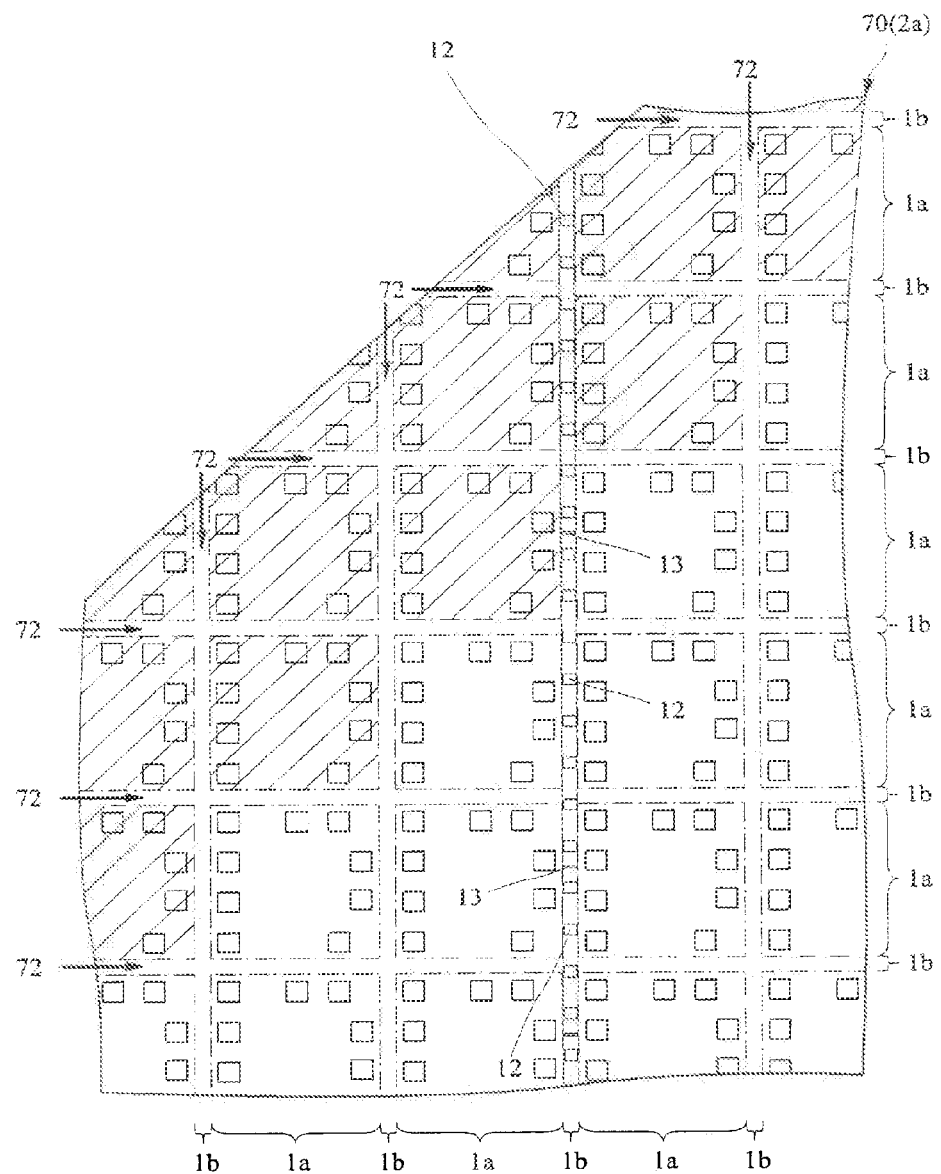
FIG. 31 is an enlarged plan view showing a semiconductor wafer being a first Comparative Example of the semiconductor wafer shown in FIG. 7.
Figure 32:
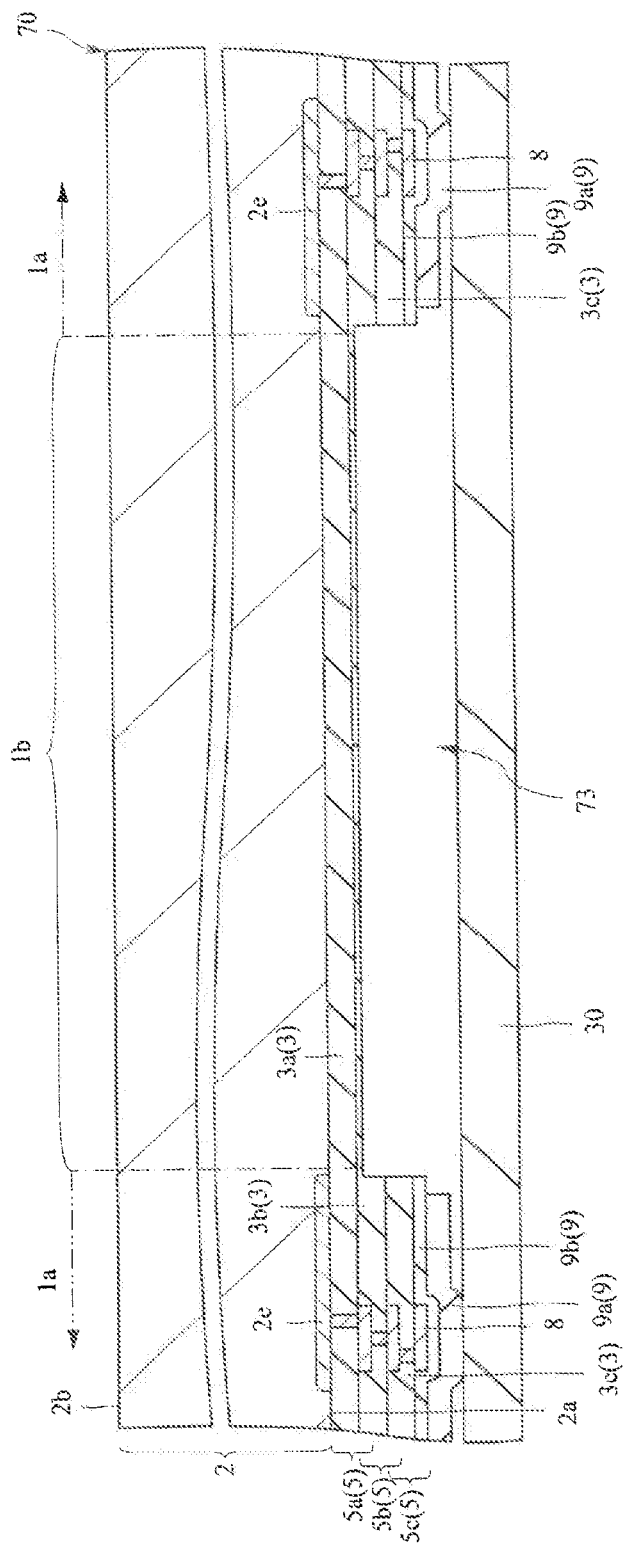
FIG. 32 is an enlarged cross-sectional view showing a state where the protective sheet is stuck on the surface of the principal surface side of the semiconductor wafer shown in FIG. 31 and, after that, the wafer is reversed.
Figure 33:
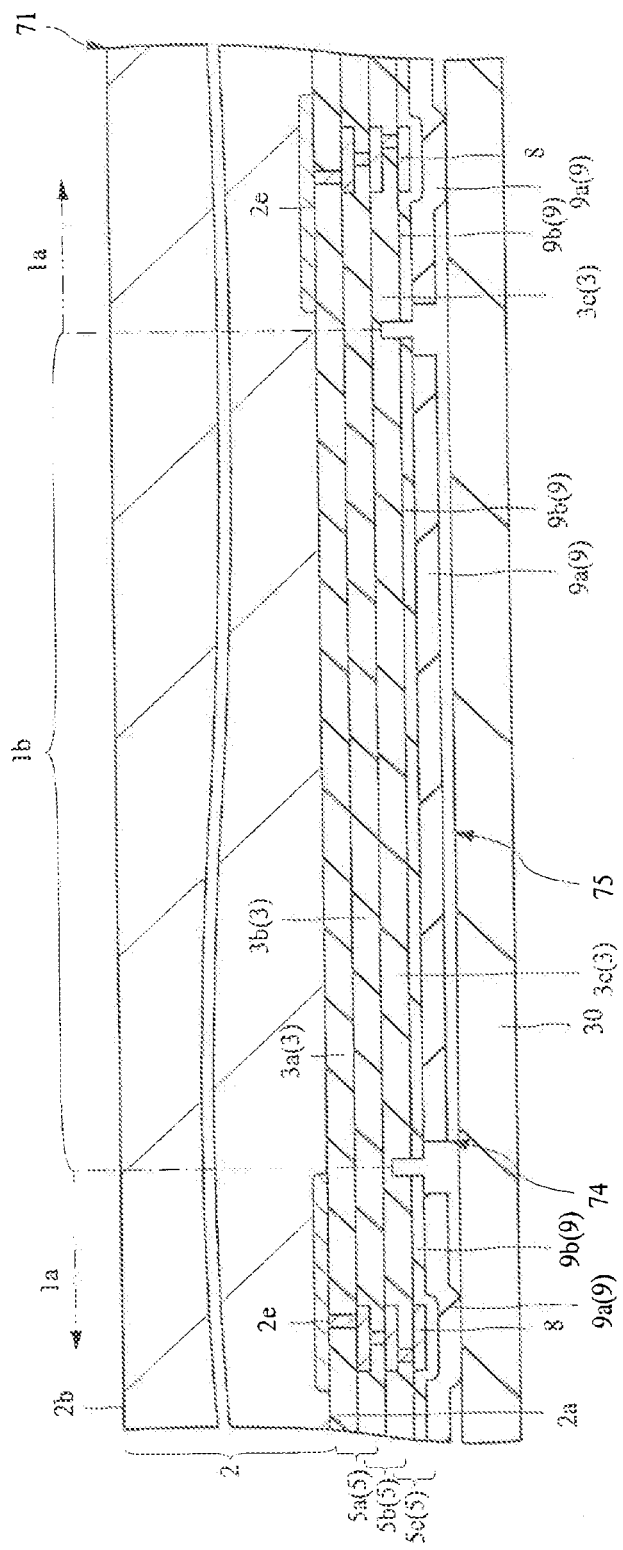
FIG. 33 is an enlarged cross-sectional view showing a state where the protective sheet is stuck on the surface of the principal surface side of a semiconductor wafer being a second Comparative Example of the semiconductor wafer shown in FIG. 21 and, after that, the wafer is reversed.

Next, as the process S2 of grinding the back surface shown in FIG. 5, the back surface 2b side of the semiconductor wafer 20 shown in FIGS. 6 to 17 is ground. FIG. 18 is a cross-sectional view showing a state in which a protective sheet is stuck to the principal surface side of the semiconductor wafer shown in FIG. 6, and FIG. 19 is an enlarged cross-sectional view of the P part in FIG. 18. FIG. 20 is a cross-sectional view showing a process of grinding the back surface of the semiconductor wafer with the stuck protective sheet shown in FIG. 18. FIG. 21 is an enlarged cross-sectional view showing a state in which a protective sheet is stuck to the surface of the principal surface side of the semiconductor wafer shown in FIG. 10 and the same is then reversed. FIG. 31 is an enlarged plan view showing a semiconductor wafer, which is a first Comparative Example of the semiconductor wafer shown in FIG. 7. FIG. 32 is an enlarged cross-sectional view showing a state in which a protective sheet is stuck to the surface of the principal surface side of the semiconductor wafer shown in FIG. 31 and the same is then reversed. FIG. 33 is an enlarged cross-sectional view showing a state in which a protective sheet is stuck to the surface of the principal surface side of a semiconductor wafer, which is a second Comparative Example of the semiconductor wafer shown in FIG. 21, and the same is then reversed.

In the process according to at least one embodiment, first, a protective sheet (protective film) 30 is stuck to the principal surface 2a side of the semiconductor wafer 20, as shown in FIG. 18. By way of more detailed explanation, a protective sheet 30 is spread in a stretched state over the principal surface 2a of the semiconductor wafer 20, and is pressed and stuck with a roller (sticking tool) 31 such as, for example, a sticking tool from the upper surface of the protective sheet 30. On the lower surface (the surface facing the semiconductor wafer 20) side of the protective sheet, a tacky layer is disposed, and, when the sheet is pressed from the upper surface side located on the side opposite to the lower surface, the tacky layer is brought into close contact with the semiconductor wafer 20 to be stuck thereto. Consequently, the surface of the principal surface 2a side of the semiconductor wafer 20 is in a state of being covered with the protective sheet 30. In the process of grinding the back surface, when the surface protection of the semiconductor wafer 20 is insufficient, the grinding process may damage or contaminate integrated circuits to cause the failure as discussed hereinabove. Therefore, covering the surface of the principal surface 2a side of the semiconductor wafer 20 by the protective sheet 30 before grinding the back surface 2b of the semiconductor wafer 20 may prevent or suppress the damage and contamination of the semiconductor wafer 20 in the process of at least one embodiment.

As shown in FIG. 19, the side surface 20c of the semiconductor wafer 20 forms an inclined surface that is not orthogonal to the principal surface 2a. Consequently, a gap 30a is formed between the side surface 20c of the semiconductor wafer 20 to which the protective sheet 30 is stuck and the protective sheet 30.

After sticking the protective sheet 30, the semiconductor wafer 20 shown in FIG. 18 is reversed vertically, and, as shown in FIG. 20, the semiconductor wafer 20 is fixed over a stage 33 of a grinding apparatus 32 via the protective sheet 30. Subsequently, the back surface 2b side of the semiconductor wafer 20 is ground and the thickness of the semiconductor wafer 20 is thinned from the back surface 2b side.

Although the grinding means in the process according to at least one embodiment is not to be restricted to the specific examples given below, for example, the back surface 2b of the semiconductor wafer 20 may be ground using a grinding member such as a whetstone 34, as shown in FIG. 20. The grinding is carried out while supplying a grinding liquid (grinding fluid) 35 to the semiconductor wafer 20. In more detail, the process of grinding the back surface in Embodiment 1 is carried out while supplying the grinding liquid 35 to the back surface 2b side of the semiconductor wafer 20 from a grinding liquid-supplying apparatus 35a. The grinding liquid 35 functions as a lubricating liquid when the whetstone 34 grinds the back surface 2b of the semiconductor wafer 20. In Embodiment 1, for example, water is used as a grinding fluid. Performing the grinding action while supplying the grinding liquid 35 makes it possible to remove the resultant grinding wastes (for example, grinding wastes made of Si) from the back surface 2b together with the grinding liquid 35.

Here, according to the examination made by the inventors of the present invention, it was known that when the stopper 11 shown in FIGS. 7 and 8 is not formed in the scribe region 1b as a semiconductor wafer 70 of the Comparative Example shown in FIG. 31, the principal surface 2a side of the semiconductor wafer 70 is contaminated in the process of grinding the back surface. In particular, foreign materials such as the grinding waste penetrate into the principal surface 2a side of the semiconductor wafer 70 together with the grinding liquid 35 (see FIG. 20) along the scribe line in the penetration direction shown by an arrow 72 in FIG. 31, to contaminate the principal surface 2a side of the semiconductor wafer 70. This is because a space 73 is formed between the scribe region 1b and the protective sheet 30 as shown in FIG. 32, and the grinding liquid 35 (see FIG. 20) penetrates through the space 73. Moreover, as shown in FIG. 19, since the gap 30a is formed between the side surface 20c of the semiconductor wafer 20 and the protective sheet 30 (the same gap 30a is also formed for the semiconductor wafer 70), the grinding liquid 35 may penetrate further easily.

As described above, when the grinding liquid 35 (see. FIG. 20) penetrates to the principal surface 2a side of the semiconductor wafer 70, the outer periphery of the semiconductor chips obtained by cutting the scribe region 1b is contaminated. Furthermore, since the surrounding area of the device region 1a is surrounded by the guard ring 8, when the insulating layer 9 covering the guard ring 8 contacts closely with the protective sheet 30 over the whole periphery, the penetration of the grinding liquid 35 (see FIG. 20) into the region more inside than the guard ring 8 can be prevented. However, when a gap occurs between the insulating layer 9 covering the guard ring 8 and the protective sheet 30, from the gap the grinding liquid 35 will penetrate into the device region 1a. That is, the region inside the guard ring 8 is contaminated.

The inventors of the present invention made various examinations about a method for preventing the penetration of the grinding liquid 35 (see FIG. 20). First, a structure in which a stopper 74 including plural insulating layers 3 and the insulating layer 9 covering the insulating layers 3 are formed in at least a part of the scribe region 1b as a semiconductor wafer 71 shown in FIG. 33, was examined. Meanwhile, the stopper 74 shown in FIG. 33 has substantially the same shape as the stopper 11 in Embodiment 1 except that the metal pattern 10 is not formed for the wiring layer 5c. It was known, however, that the stopper 74 shown in FIG. 33 cannot sufficiently prevent the penetration of the grinding liquid 35 into the principal surface 2a side and even the interior portion of the effective chip region of the principal surface 2a side is contaminated. As shown in FIG. 33, the height from the principal surface 2a to the insulating layer 9 covering the guard ring 8 is greater than the height from the principal surface 2a to the insulating layer 9 of the stopper 74. Therefore, a space 75 is formed between the protective sheet 30 and the stopper 74. It is considered that, although the space 75 has a smaller area as compared with the space 73 shown in FIG. 32, the stopper 74 was not in close contact with the protective sheet 30 and thus the grinding liquid 35 penetrated from the space 75 by the influence of vibration etc. during the grinding process.

Then, the inventors of the present invention examined a structure in which the insulating layer 9 of the stopper 74 closely contacts with the protective sheet 30, that is, the constitution of the stopper 11 of Embodiment 1 as shown in FIG. 10, wherein the metal pattern 10 is formed for the wiring layer 5c and is covered by the insulating layer 9. As the result of subjecting the semiconductor wafer 20 of Embodiment 1 to the process of grinding the back surface, it was recognized that the grinding liquid 35 (see FIG. 20) penetrated along the scribe line (scribe region 1b) from the outer periphery side of the semiconductor wafer 20 shown in FIG. 7. However, it was confirmed that almost all foreign materials such as the grinding waste were intercepted by the stopper 11 disposed at the outermost periphery, and that a small amount of foreign material that had entered the region further inside than the stopper 11 at the outermost periphery was completely intercepted by the stopper 11 of a second row disposed inside the outermost periphery. Each of the stopper 11 at the outermost periphery and the stopper 11 of the second row is the stopper 11 disposed around the device region 1a of the ineffective chip region, and it was confirmed that the device region 1a of the effective chip region was not contaminated. That is, by disposing the stopper 11 around the device region 1a of the ineffective chip region, the contamination of the device region 1a of the effective chip region was prevented, as explained further below.

As shown in FIG. 21, according to Embodiment 1, the formation of the metal pattern 10 raises the insulating layer 9 covering the metal pattern 10 up to the same height as the insulating layer 9 covering the guard ring 8. Consequently, when the protective sheet 30 is stuck to the surface of the principal surface 2a side of the semiconductor wafer 20, it is possible to cause the insulating layer 9 of the stopper 11 to closely contact with (for example, stick to) the protective sheet 30. Then, by causing the protective sheet 30 to closely contact with (stick to) the stopper 11 to fix them firmly, the influence of vibration etc. during the process of grinding the back surface can be reduced. As the result, the stopper 11 can prevent or suppress the penetration of the grinding liquid 35 (see FIG. 20).

Incidentally, in Embodiment 1, also a space 36 is formed between the protective sheet 30 and the semiconductor wafer 20. The space 36 is formed by the trench 9d, which separates the insulating layer 9 of the device region 1a from the insulating layer 9 of the scribe region 1b for preventing the development of a damage to the device region 1a when the damage occurs in the insulating layer 9 of the scribe region in the dicing process to be described later. Accordingly, for the purpose of preventing simply the penetration of the grinding liquid 35 (see FIG. 20), it is preferable that the space 36 is not to be formed, but, in order to suppress the lowering of the reliability of the semiconductor chip 1 shown in FIGS. 1 to 4 caused by the damage of the insulating layer 9, the avoidance of the formation of the space 36 is difficult.

Therefore, in Embodiment 1, by causing the protective sheet 30 to closely contact with the stopper 11, the space 36 has a smaller cross-sectional area as compared with the space 75 shown in FIG. 33. By making the cross-sectional area of the space 36 sufficiently small, the grinding liquid 35 (see FIG. 20) supplied in the process of grinding the back surface fills the space 36 in a short time. The phenomena occur at respective positions in which the stopper 11 is disposed, and at the same timing. Then, a gas (for example, air) on the central side from the stopper 11 is contained inside the stopper 11 (the central side of the semiconductor wafer 20). As the result, the inner pressure of the gas contained inside the stopper 11 is comparable to the penetration pressure of the grinding liquid 35 (see FIG. 20) so as to stop the penetration of the grinding liquid 35 at the position of the stopper 11. That is, the penetration of the grinding liquid 35 (see FIG. 20) into the plural spaces 36 approximately at the same time gives a sealing effect that prevents additional penetration of the grinding liquid 35. Moreover, when foreign materials such as the grinding waste clog the space 36 caused by a small cross-sectional area of the space 36, the cross-sectional area of the space 36 becomes smaller to make the penetration of the grinding liquid 35 (see FIG. 20) more difficult.

For obtaining the above-described sealing effect, it is preferable to have a small volume for a space 50 lying behind the space 36 formed between the metal pattern 10 and the guard ring 8 shown in FIG. 9, that is, a space 50 that is formed nearer to the center of a side of the semiconductor wafer 20 than the metal pattern 10 and adjacent to the space 36. By making the volume of a space 50 adjacent to the space 36 smaller, gas inside the space is likely to be compressed rapidly compared to the penetration pressure of the penetrating grinding liquid 35 (see FIG. 20). In Embodiment 1, as shown in FIG. 9, the insulating layer 3 and the insulating layer 9 are not removed from the region behind the metal pattern 10 (in FIG. 9, the region surrounded by four metal patterns 10). In other words, no trench 1c is formed. Accordingly, the volume of the space 50 adjacent to the space 36 shown in FIG. 21 can be made smaller, and thus the sealing effect is obtained.

Furthermore, in the case of the stopper 74 shown in FIG. 33, even if the sealing effect is obtained just after the start of the process of grinding the back surface, the cross-sectional area of the space 75 changes easily by, for example, vibration occurring in the process of grinding the back surface, because the stopper 74 is not in close contact with the protective sheet 30. As the result, the balance between the penetration pressure of the grinding liquid 35 and the inner pressure of a gas contained in the stopper 74 is broken, and thus the sealing effect cannot be maintained. On the other hand, in Embodiment 1, the stopper 11 is in close contact with the protective sheet 30, thereby making it possible to reduce the variation amount of the cross-sectional area of the space 36 even when vibration occurs in the grinding process, and to maintain the sealing effect. As the result, according to Embodiment 1, the contamination of the device region 1a (in particular, the device region 1a of the effective chip region) can be prevented even when the space 36 lies between the protective sheet 30 and the stopper 11. That is, according to Embodiment 1, it is possible to prevent the contamination of the device region 1a, and to prevent the damage of the insulating layer 9 of the device region 1a.

In Embodiment 1, as shown in FIG. 7, for scribe lines (scribe regions 1b) other than the scribe lines (scribe regions 1b) to which plural test patterns 12 are arranged, the stopper 11 is disposed at each of the intersections. On the other hand, no stopper 11 is disposed in the scribe lines (scribe regions 1b) to which plural test patterns 12 are arranged. The reason is discussed below. First, as shown in FIG. 7, since plural test patterns 12 are arranged densely in specified scribe lines, sufficient space for disposing the stopper 11 may not be available. Further, as shown in FIG. 12, the entirety of outer marginal part of the test pattern 12 is covered by the insulating layer 9. Consequently, in the process of grinding the back surface, the insulating layer 9 covering the outer marginal part of the test pattern 12 has, for example, as shown in FIG. 13, the same height as the insulating layer 9 covering the guard ring 8. As a result, the insulating layer 9 covering the outer marginal part of the test pattern 12 can be closely contacted with the protective sheet 30 (see FIG. 21). Therefore, by arranging the test pattern 12 thusly with respect to the scribe line, the penetration of the grinding liquid 35 (see FIG. 20) can be suppressed.

However, the area of the insulating layer 9 in close contact with the protective sheet 30 (see FIG. 21) is smaller than that of the insulating layer 9 covering the metal pattern 10 of the stopper 11 shown in FIG. 10. Therefore, if it is possible to provide a space for disposing the stopper 11, it is more preferable to dispose the stopper 11. Since the penetration of the grinding liquid 35 can be suppressed by arranging the test pattern 12, a method for forming the test pattern 12 for all the scribe regions may be considered. However, in that case, a new problem can occur in that the load on the dicing blade increases in the dicing process to be described later.

Meanwhile, as to the fuse target 13, for example, as shown in FIG. 16, a large opening is formed around the fuse target 13 extending along the direction of the scribe line (scribe region 1b), and, therefore, the arrangement of the fuse target 13 cannot provide the aforementioned sealing effect.

In Embodiment 1, as shown in FIG. 7, the stopper 11 is disposed at each of intersections of respective scribe lines other than scribe lines in which the test pattern 12 is arranged. That is, the patterning is carried out regularly so as to provide the same shape to metal patterns 10, and to trenches 1c and 9d in the ineffective chip region and the effective chip region. Such regular arrangement of the stopper 11 provides the following effect.

First, in the above-described process of sticking the protective sheet 30 (see FIG. 18), if wrinkles occur in the protective sheet caused by sticking failure thereby generating a gap in a part between the stopper 11 and the protective sheet 30, the contamination may spread into the effective chip region. However, the expansion of a region that might be contaminated can be prevented by disposing the stopper 11 at all the intersections of each scribe line (in Embodiment 1, scribe lines in which the test pattern 12 is arranged are excluded).

Second, the regular arrangement of the stopper 11 enables the metal pattern 10, and the trenches 1c and 9d etc. to be formed effectively. In general, when a mask pattern for forming the metal pattern, the trench, the opening etc. is formed, a semiconductor wafer having a resist film coating over the surface to be processed is set in an exposure apparatus, and an exposure treatment, a development treatment, and a baking treatment are carried out to transfer the mask pattern of the master mask to the resist film. Since the formation of the mask pattern collectively for the whole of the principal surface side of the semiconductor wafer is difficult, the process is carried out by a step and repeat system, in which a series of transfer treatments are carried out by sequential scanning for one semiconductor wafer. In the step and repeat system, an increased number of the device regions that can be processed in one treatment can reduce the number of repeated treatments, thus improving the manufacturing efficiency. Here, when patternings of different shapes are carried out for the ineffective chip region and the effective chip region, the number of device regions that can be processed in one treatment becomes extremely small. On the other hand, when the patterning of the same shape is carried out for the ineffective chip region and the effective chip region, as is the case for Embodiment 1, the number of device regions that can be processed in one treatment can be increased. For example, in the case of the semiconductor wafer 20 in Embodiment 1 shown in FIG. 7, the transfer treatment of the plural device regions 1a including the scribe line in which the test pattern 12 is arranged and the scribe line in which the stopper 11 is disposed can be carried out collectively without discriminating between the ineffective chip region and the effective chip region. Therefore, according to Embodiment 1, the metal pattern 10, the trenches 1c and 9d etc. can be formed more effectively.

Next, a preferable embodiment of the metal pattern 10 constituting the stopper 11 will be explained. The metal pattern 10 constituting the stopper 11 has a planar shape of a rectangle as described above, wherein a longer length of the long side extending in the direction intersecting the scribe line is more preferable for increasing the close-contact area of the protective sheet 30 and the insulating layer 9 shown in FIG. 21.

In Embodiment 1, however, the metal pattern 10 is arranged further on the scribe region 1b side than on the boundary line of the device region 1a and the scribe region 1b (in Embodiment 1, the position where the trench 9d is formed), for the following reasons. A first reason is that, if the metal pattern 10 is arranged so as to extend from the scribe region 1b to the device region 1a, there is concern for the occurrence of etching failure caused by the metal pattern 10 functioning as an obstacle in the process of forming the trench 9d shown in FIG. 10. If the metal pattern 10 is arranged in the position in which the trench 9d is to be formed, the metal pattern 10 will be exposed from the insulating layer 9, which may cause the occurrence of corrosion in the exposed part of the metal pattern 10. As a second reason, there is concern that, if the metal pattern 10 is arranged so as to extend from the scribe region 1b to the device region 1a, the stress upon cutting the metal pattern 10 may be transmitted to the insulating layer 9 in the device region 1a via the metal pattern 10 in the dicing process. This can cause the occurrence of cracking or chipping in the insulating layer 9 in the device region 1a. Therefore, in Embodiment 1, the metal pattern 10 is arranged in the scribe region 1b and is not arranged in the device region 1a.

Further, as shown in FIG. 21, an interval L1 from the end of the trench 9d on the scribe region 1b side, the trench separating the insulating layer 9 of the device region 1a from the insulating layer 9 of the scribe region 1b, to the end of the metal pattern 10 is shorter than an interval L2 from the end of the trench 9d on the device region 1a side to the end of the guard ring 8. In other words, the metal pattern 10 is arranged so as to lie nearer to the trench 9d, that is, the boundary of the device region 1a and the scribe region 1b, than to the guard ring 8. The guard ring 8 has a function of preventing the penetration of moisture into the device region 1a as described above. Moreover, in Embodiment 1, the guard ring 8 is electrically coupled with the semiconductor element 2e to which the reference potential is supplied. Therefore, the corrosion of the guard ring 8 itself should be prevented. Consequently, it is preferable to form the guard ring 8 so as to be kept apart from the boundary line of the device region 1a and the scribe region 1b in a direction toward the device region 1a side. On the other hand, the metal pattern 10 is a metal pattern having a floating structure not electrically coupled to the electric circuit formed for the semiconductor chip shown in FIGS. 1 to 4, as described above. Accordingly, it is preferable to arrange the metal pattern 10 to be close to the device region 1a within the range where the pattern is not exposed, for the purpose of increasing the close-contact area of the protective sheet 30 and the insulating layer 9. Therefore, in Embodiment 1, the metal pattern 10 is arranged so as to lie closer to the trench 9d than to the guard ring 8 to achieve the increase in the close-contact area of the protective sheet 30 and the insulating layer 9. This can also reduce the cross-sectional area of the space 36 shown in FIG. 21, while enhancing the above-described sealing effect.

In Embodiment 1, as shown in FIG. 9, each of the metal patterns 10 is arranged to be between adjacent device regions 1a among plural device regions 1a arranged in a matrix shape. In more detail, the metal patterns 10 are arranged at positions where the extension line of the long side of respective metal patterns 10 intersects the guard ring 8. In other words, each of the metal patterns 10 is not formed within the intersection where scribe lines intersect each other, but is formed outside the intersection. Therefore, the insulating layer 3 and the insulating layer 9 of the stopper 11 have a shape having projections 11d each projecting from the intersection of the scribe lines in the extended direction of respective scribe lines, and the metal pattern 10 is formed for the projection 11d. The arrangement of the metal pattern 10 as described above enables the metal pattern 10 to be disposed close to the guard ring 8. As shown in FIG. 21, the width of the space 36 is defined by the interval from the metal pattern 10 to the guard ring 8. Further, a relatively smaller width of the space 36 can enhance the sealing effect. That is, as shown in FIG. 9, by arranging the metal pattern 10 to be between adjacent device regions 1a instead of the region where scribe lines (scribe regions 1b) intersect each other, it is possible to make the width of the space 36 shown in FIG. 21 smaller, and, therefore, to achieve better suppression of the penetration of the grinding liquid 35 (see FIG. 20). Furthermore, it is possible to make longer the interval of a pathway running from the space 36, being a narrow space formed between the metal pattern 10 and the guard ring 8 shown in FIG. 21, to a space for which the trench is (see FIG. 9) broader than the space 36 is formed, by thusly arranging the metal pattern 10 to be outside the intersection. Consequently, it becomes easier to make the penetration pressure of the grinding liquid 35 (see FIG. 20) to be comparable with the pressure of a gas in the space adjacent to the space 36, and to thus obtain the sealing effect.

As shown in FIG. 9, in Embodiment 1, plural (four) metal patterns 10 are arranged with respect to each of the intersections of scribe lines such that each of the metal patterns 10 is arranged to be between adjacent device regions 1a. In other words, each of the stoppers 11 in Embodiment 1 has plural (four) metal patterns 10. The formation of metal patterns 10 for each of the stoppers 11 as described above can increase the close-contact area of the protective sheet 30 and the stopper 11 shown in FIG. 21. Consequently, it is possible to reduce the influence of the vibration etc. in the process of grinding the back surface, thus making it possible for the stopper 11 to prevent or suppress the penetration of the grinding liquid 35 (see FIG. 20) while maintaining the sealing effect.

After the grinding of the back surface 2b to thin the semiconductor wafer 20 to a prescribed dimension (in Embodiment 1, for example, 240 µm) as described above, the protective sheet 30 is peeled off the semiconductor wafer to complete the process. Meanwhile, for removing grinding wastes remaining over the back surface 2b, for example, a polishing processing is preferably carried out for the back surface 2b using polishing particles. The protective sheet 30 is peeled off after the completion of the polishing processing, for preventing the contamination of the principal surface 2a side of the semiconductor wafer 20 by grinding wastes that are generated during the polishing processing.

3. Dicing Process

Figure 22:
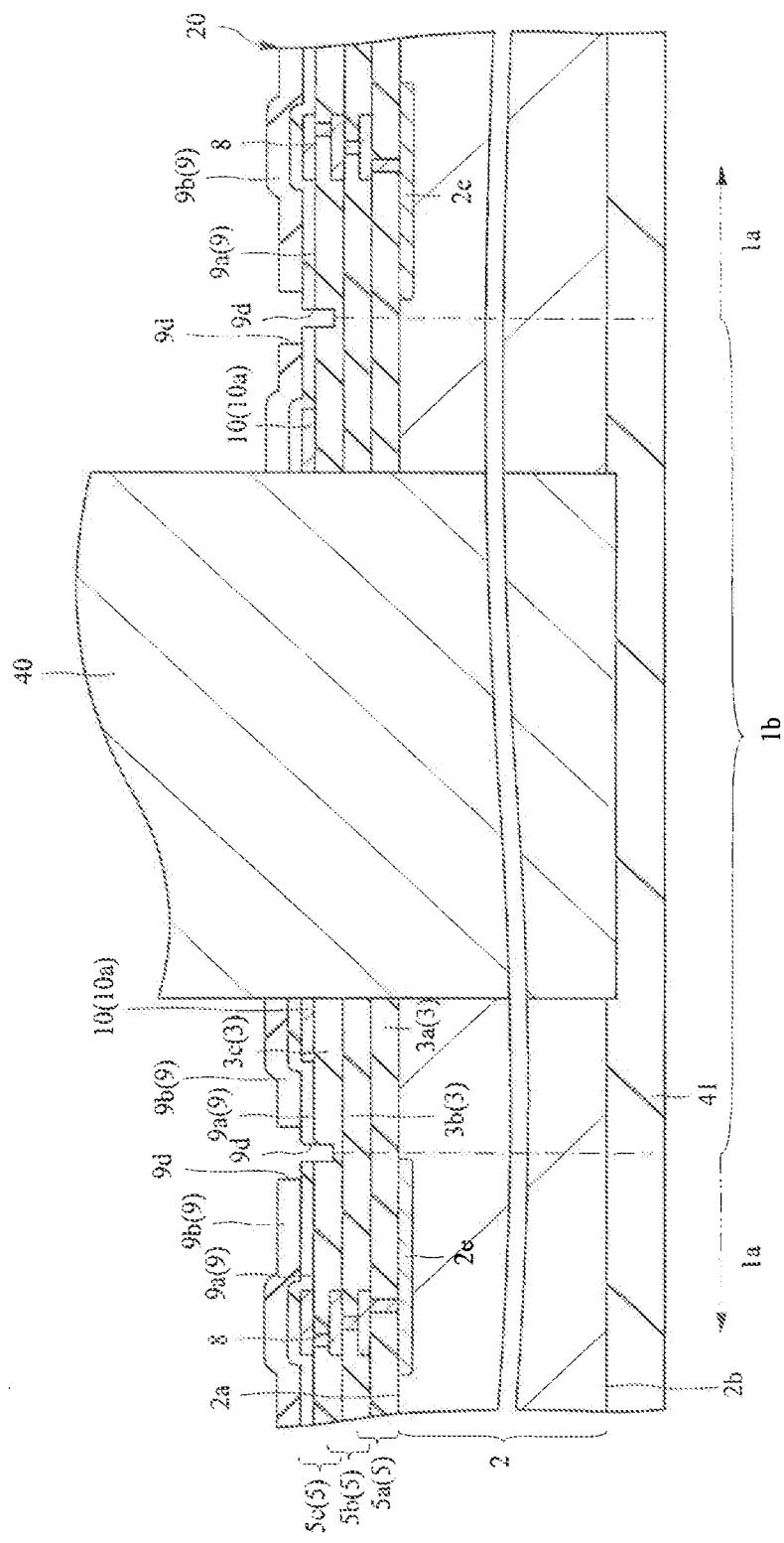
FIG. 22 is an enlarged cross-sectional view showing a state where the semiconductor wafer after the grinding of the back surface is cut with a dicing blade.
Figure 23:
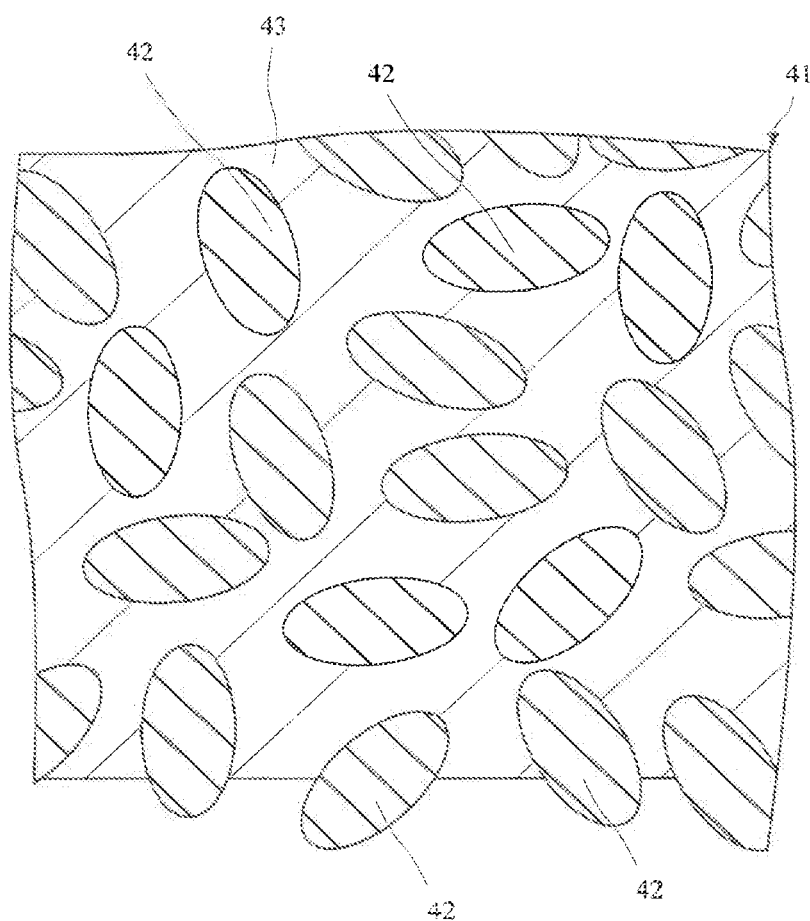
FIG. 23 is an enlarged cross-sectional view showing the structure of the dicing blade shown in FIG. 22.
Figure 24:
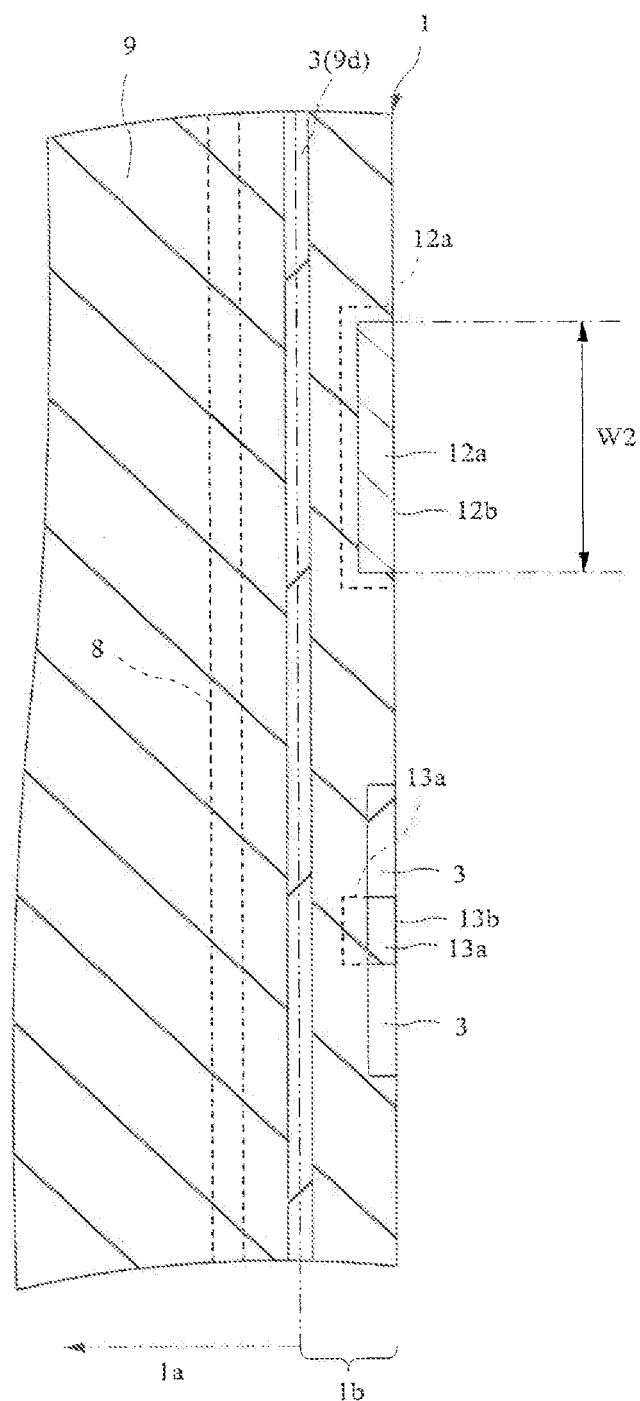
FIG. 24 is an enlarged plan view showing a semiconductor chip obtained after cutting the plane shown in FIG. 12.

Next, regarding the dicing process S3 shown in FIG. 5, as shown in FIG. 22, the semiconductor wafer 20 is cut along the scribe region (scribe line, dicing line) 1b of the semiconductor wafer 20. FIG. 22 is an enlarged cross-sectional view showing a state of the semiconductor wafer after the back surface grinding has been cut with a dicing blade. FIG. 23 is an enlarged cross-sectional view showing the structure of the dicing blade shown in FIG. 22. FIG. 24 is an enlarged plan view showing a semiconductor chip after cutting the plane shown in FIG. 12.

In embodiments of the present process, a dicing blade 40 which is a cutting tool is run along the scribe region 1b to divide the semiconductor wafer 20 into pieces for each of the device regions 1a to obtain plural semiconductor chips 1.

In Embodiment 1, as shown in FIG. 22, a dicing tape 41 stuck to the back surface 2b is cut from the principal surface 2a side to the back surface 2b to form individual pieces for each of the device regions 1a. One reason of carrying out the cutting in the state where the dicing tape 41 is stuck is to prevent scattering of the cut semiconductor chips 1 (see FIGS. 1 to 4). Another reason for carrying out the cutting in the state where the dicing tape 41 is stuck is to carry out the alignment of the semiconductor wafer 20 over a dicing stage (not shown). Accordingly, over the surface where the dicing tape 41 and the semiconductor wafer 20 face each other, a tacky layer is disposed, and the back surface 2b of the semiconductor wafer 20 is firmly fixed to the dicing tape 41 via the tacky layer. Meanwhile, the tacky layer contains a component that cures by applying such energy as heat or ultraviolet rays. In Embodiment 1, for example, the tacky layer is made of an ultraviolet curable resin. Accordingly, pieces of the semiconductor chips 1 can be peeled off easily from the dicing tape 41 by irradiating ultraviolet rays onto the dicing tape 41 after the completion of the process.

The dicing blade 40 is a cutting blade attached to the outer periphery of a supporting member (not shown) capable of high-speed rotation, for example, such as a spindle, wherein plural (many) abrasive grains 42 made of such a material having a relatively higher hardness than a member to be processed, such as diamond, are fixed firmly for a base material (not shown) of a cutting blade part with a binding material (bonding material) 43 made of metal and resin, as shown in FIG. 23. A part of these abrasive grains 42 are exposed from the surface of the dicing blade 40 (the surface of the binding material 43). As shown in FIG. 22, when the dicing blade 40 is rotated and pressed against the scribe region 1b, respective members arranged in the scribe region 1b are cut by the abrasive grain 42. In more detail, as shown in FIG. 23, the dicing blade 40 containing the abrasive grain 42 carries out the cutting processing such that the abrasive grains 42 cut respective members arranged at the scribe region 1b (see FIG. 22) and remove generated cutting wastes. In the cutting processing, the dicing blade 40 processes the semiconductor wafer 20 (see FIG. 22) while abrading the binding material 43 to let worn-out abrasive grains 42 fall and to expose fresh abrasive grains 42 (e.g., spontaneous edge sharpening).

Accordingly, when members having a relatively lower hardness than the binding material 43 of the dicing blade 40, for example, polyimide resin or metal such as aluminum, are to be subjected to the cutting processing, clogging, in which cutting wastes clog the gap of the exposed abrasive grains 42, tends to occur easily. Moreover, since the binding material 43 is not sufficiently worn away, fresh abrasive grains 42 cannot be exposed, which decreases cutting performance. As the result, dicing failure may occur. That is, in Embodiment 1, when many materials having relatively lower hardness than the binding material 43 are contained in the materials constituting the scribe region 1b to be processed, dicing failure can occur. For example, when such a resin material as polyimide resin is used for the insulating layer 9, dicing failure can occur caused by the clogging of the dicing blade 40. Accordingly, as the material that constitutes the insulating layer 9, a material with a higher hardness than polyimide resin is preferable, and a material with a higher hardness than the binding material 43 of the dicing blade 40 is particularly preferable. In Embodiment 1, for example, a metal bond blade, in which diamond abrasive grains are bound by a plating method using nickel (Ni) as the main component of the binding material 43, is used. As dicing blades formed by fixed abrasive grains 42, in addition to the metal bond blade, there is a resin blade in which resin is used as the binding material to provide higher durability as compared to the resin blade.

In Embodiment 1, as the insulating layer 9, a film of an inorganic insulating material is used, as described above, such as a silicon oxide film ($SiO_2$ film) or a silicon nitride film (SiN film) with a higher hardness than the binding material 43 of the dicing blade 40. Accordingly, clogging of the dicing blade 40 can be prevented. Moreover, since fresh abrasive grains 42 can be exposed by wearing the binding material 43, cutting performance can be preserved to prevent the occurrence of dicing failure.

In Embodiment 1, among respective members arranged at the scribe region 1b, members containing a conductive material (specifically, the metal pattern 10, the test pattern 12, and the fuse target 13) contain aluminum as described above, and have a hardness lower than or the same degree as that of the binding material 43 of the dicing blade 40. However, since these members can be formed collectively with the wiring 4c and the pad 7 shown in FIG. 3 to improve the manufacturing efficiency, the selection of the material must also be based on electric properties.

Accordingly, in Embodiment 1, the occurrence of dicing failure is suppressed by reducing the amount of the metal pattern 10, the test pattern 12 and the fuse target 13 to be cut and processed by the dicing blade 40. First, in Embodiment 1, the number of test patterns 12 to be arranged is restricted to the lowest limit necessary to support evaluation by electric test of the semiconductor wafer 20, by providing the stopper 11. Moreover, the metal pattern 10 formed for the stopper 11 is formed so as to have a planar shape of a rectangle, and respective metal patterns 10 are arranged so as to extend in the direction intersecting the extended direction of the scribe line. That is, the short side of the metal pattern 10 is arranged to be along the extended direction of the scribe line. This can reduce the amount of the conductive materials to be cut and processed by the dicing blade 40 to suppress the occurrence of dicing failure caused by clogging.

Meanwhile, even when a member containing a material softer than the binding material 43 (see FIG. 23) is subjected to the cutting processing, the occurrence of clogging can be suppressed by carrying out the cutting processing with a harder material than the binding material 43. This is because when the member containing the harder material is cut, the binding material 43 shown in FIG. 23 is worn to drop off the worn-out abrasive grains 42 and fresh abrasive grains 42 can be exposed. In Embodiment 1, the dicing blade 40 is run along the short side of the metal pattern 10, and, consequently, when the metal pattern 10 is cut, it is subjected to the cutting processing along with the surrounding insulating layer 9. Accordingly, the occurrence of clogging can be suppressed. Further, in Embodiment 1, since the dicing blade 40 cuts the semiconductor wafer 20, it will carry out the cutting processing up to at least the adhesion boundary between the back surface 2b of the semiconductor wafer 20 and the dicing tape 41. Since the base material of the dicing tape 41 contains, for example, polyimide resin etc., if the dicing tape 41 alone is subjected to the cutting processing, clogging may occur. However, by carrying out the cutting processing from the surface (principal surface 2a) side on the opposite side of the back surface 2b to which the dicing tape 41 is stuck, as in Embodiment 1, the dicing blade 40 will cut the hard semiconductor substrate 2 together with a part of the dicing tape 41. Accordingly, the occurrence of clogging of the dicing blade 40 can be suppressed, in contrast with the case where, for example, polyimide resin is used as the insulating layer 9.

In the manufacturing process of the semiconductor chip 1 (see FIG. 1) having a relatively small planar dimension as in Embodiment 1, one semiconductor wafer 20 has an increased number of scribe lines to increase the number of times of the cutting processing by the dicing blade 40, in embodiments of the present process. Consequently, the dicing blade 40 can be damaged. Each time the damage frequency of the dicing blade 40 increases, replacing the damaged dicing blade 40 becomes necessary, which decreases manufacturing efficiency. Moreover, damage occurring in the cutting processing causes dicing failure.

Therefore, for improving manufacturing efficiency, a narrower width of the scribe region 1b (the width of the scribe line) is provided to increase the number of semiconductor chips 1 (see FIG. 1) obtainable from one semiconductor wafer 20. However, a narrower width of the scribe region 1b requires a corresponding narrower width of the dicing blade 40. For example, in Embodiment 1, the width of the scribe region 1b 60 μm. When the width of the dicing blade 40 is made narrower, the dicing blade 40 is more likely to be damaged.

As described above, in the process of manufacturing a semiconductor device of Embodiment 1, which is a small-sized semiconductor chip, a technology for preventing or suppressing the damage of the dicing blade 40 becomes necessary. For preventing or suppressing the damage of the dicing blade 40, it is preferable to reduce the load on the dicing blade 40 in the process. The load on the dicing blade 40 can be reduced by reducing the amount of respective members constituting the scribe region 1b. In Embodiment 1, as shown in FIG. 7, each part of the insulating layer 9 and insulating layer 3 is removed by forming the trench is in positions where no stopper 11, test pattern 12 or fuse target 13 is formed. Therefore, it is possible to reduce the amount of respective members constituting the scribe region 1b, and to reduce the load on the dicing blade 40. Moreover, in Embodiment 1, since the dicing is carried out after the process of grinding the back surface described above, the load on the dicing blade 40 is reduced.

When the dicing blade 40 is run along respective scribe lines of the semiconductor wafer 20 to divide respective device regions 1a into individual pieces, the semiconductor chip 1 shown in FIGS. 1 to 4 can be obtained in plural numbers.

In the semiconductor chip 1 obtained by the manufacturing method as described above and is shown in FIGS. 1 to 4, as shown in FIG. 4, the metal pattern 10a cutting residue of the metal pattern 10 (see FIG. 9) is formed spaced apart from the guard ring 8.

The interval from the metal pattern 10a to the end of the trench 9d is shorter than the interval from the trench 9d to the end of the guard ring 8 (in more detail, the end of the guard ring 8 formed for the uppermost layer).

In Embodiment 1, as shown in FIG. 7, since the stopper 11 is disposed at each intersection of scribe lines, the metal pattern 10a, which is the cutting residue of the metal pattern 10 and is shown in FIG. 4, is formed in plural numbers for each of four corners of the semiconductor chip 1.

The cutting of the scribe region 1b for which the test pattern 12 and the fuse target 13 are formed as shown in FIG. 12 gives a planar shape as shown in FIG. 24. In more detailed explanation, the metal pattern 12a cutting residue of the test pattern 12 (see FIG. 12) is formed in a region other than the region in which the metal pattern 10a shown in FIG. 4 is formed. In the region where the metal pattern 12a is formed, plural insulating layers 3 are laminated as is the case for the device region 1a, the metal pattern 12a is formed for the wiring layer 5c (see FIG. 3) wiring layer of the uppermost layer, and a part of the metal pattern 12a is covered by the insulating layer 9. For the insulating layer 9, however, an opening is formed, and a part of the upper surface of the metal pattern 12a is exposed from the insulating layer 9. Since a side surface (cutting surface) 12b of the metal pattern 12a is cut in the dicing process, the entire side surface 12b is exposed from the insulating layer 9. Since the test pattern 12 (see FIG. 12) has a large horizontal area because it is used as an electrode for a test as described above, the width W2 of the side surface 12b, which is the cutting residue thereof, of the metal pattern 12a is wider than the width W1 of the side surface 10b of the metal pattern 10a shown in FIG. 4. In other words, the width of the metal pattern 10a (the length in the direction along the side of the semiconductor chip 1) W1 is narrower than the width of the metal pattern 12a (the length in the direction along the side of the semiconductor chip 1) W2. As described above, the metal pattern 10a is thus distinguished from the metal pattern 12a.

The metal pattern 13a cutting residue of the fuse target 13 (see FIG. 12) is formed in a region different from the region shown in FIG. 4 in which the metal pattern 10a is formed. Over the region in which the metal pattern 13a is formed, plural insulating layers 3 are laminated, in the same manner as in the device region 1a, the metal pattern 13a is formed for the wiring layer 5c (see FIG. 3) uppermost wiring layer, and a part of the metal pattern 13a is covered by the insulating layer 9. An opening is however formed in the insulating layer 9, to expose a part of the upper surface of the metal pattern 13a from the insulating layer 9. Moreover, since the side surface (cutting surface) 13b of the metal pattern 13a is cut in the dicing process, the entire side surface 13b is exposed from the insulating layer 9. For the purpose of enlarging the exposed area of the fuse target 13 (see FIG. 12) to improve recognition accuracy, an opening is formed around the fuse target 13 by removing part of each of the insulating layer 9 and the insulating layer 3. Consequently, from a surrounding portion of the metal pattern 13a cutting residue of the fuse target 13, parts of the insulating layer 9 and insulating layer 3 are removed. Thus, the metal pattern 10a is distinguished from the metal pattern 13a.

Meanwhile, the obtained semiconductor chip 1 may be implemented over a lead frame or a wiring substrate to assemble a semiconductor package. However, a detailed explanation of the assembling process is omitted in Embodiment 1.

Embodiment 2

Figure 25:
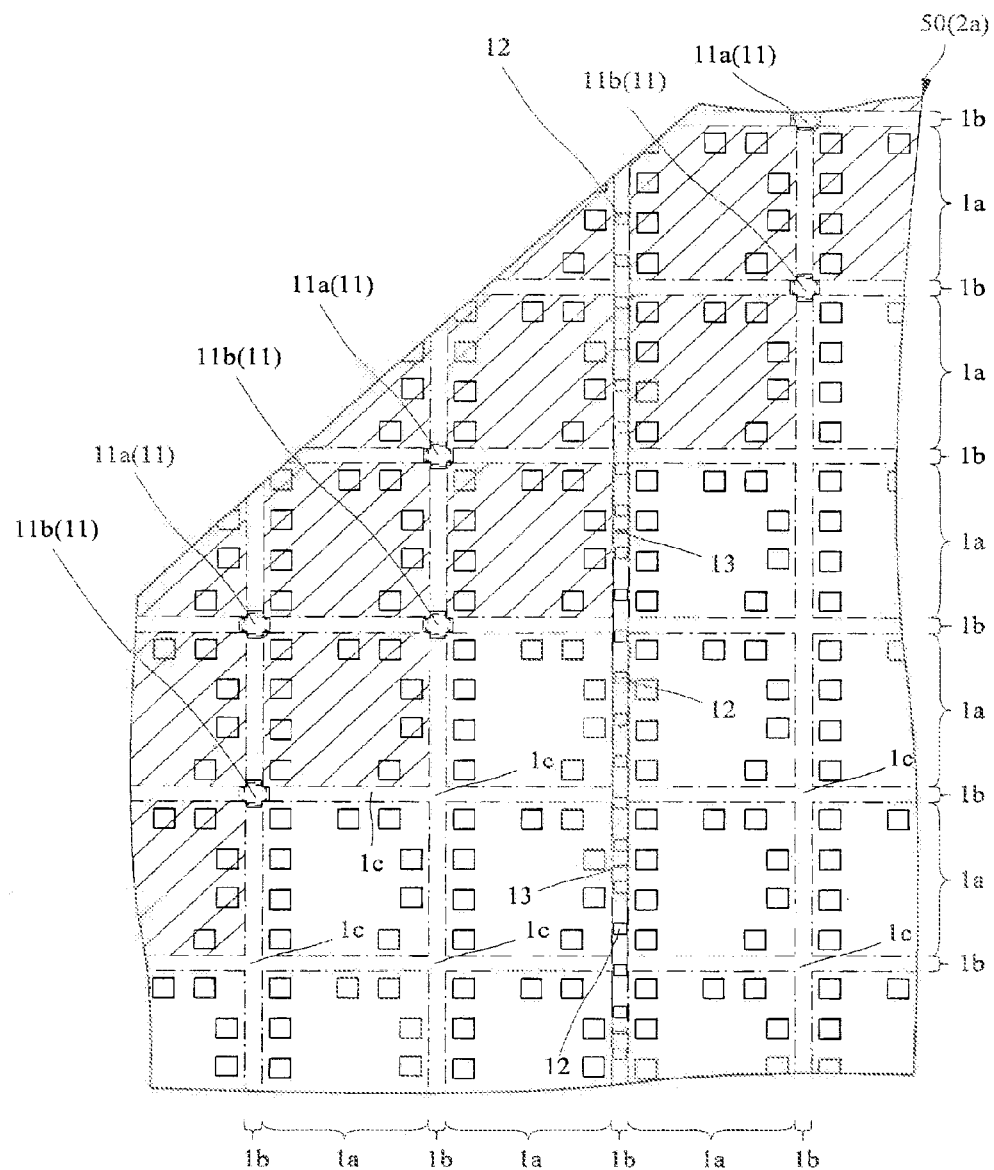
FIG. 25 is an enlarged plan view showing a part of a semiconductor wafer being a modified example of the semiconductor wafer shown in FIG. 7.

In embodiment 1, an embodiment, having an arrangement layout of the stopper 11 over the principal surface 2a of the semiconductor wafer 20 such that the stopper 11 is disposed at each of intersections of plural scribe lines was described. In Embodiment 2, a modified example of the layout of the stopper 11 is described as follows. FIG. 25 is an enlarged plan view showing a part of a semiconductor wafer being a modified example of the semiconductor wafer shown in FIG. 7. Meanwhile, a semiconductor wafer 50 in Embodiment 2 is substantially the same as the wafer in Embodiment 1 except for the layout of the stopper 11. Accordingly, overlapping explanations are omitted with respect to FIGS. 1 to 23 explained in Embodiment 1.

A difference between the semiconductor wafer 50 in Embodiment 2 shown in FIG. 25 and the semiconductor wafer 20 in Embodiment 1 shown in FIG. 7 lies in the layout of the stopper 11. In more detailed explanation, the semiconductor wafer 50 has plural intersections where plural scribe lines (scribe regions 1b) extending in the row direction and plural scribe lines (scribe regions 1b) extending in the column direction intersect each other, as is the case for the semiconductor wafer 20 shown in FIG. 7. Among these intersections, for intersections of the outermost periphery relative to the plane of the principal surface 2a side of the semiconductor wafer 50 and for intersections of the second row lying inside the outermost periphery, the stopper 11 is formed. For intersections lying inside the second row, no stopper 11 is formed.

As explained in Embodiment 1, according to the examination made by the inventors of the present invention, it was known that, by providing the stopper 11 at least at the outermost periphery among intersections of the scribe regions 1b, the contamination of regions inside the stopper 11 can be suppressed. Moreover, it was known that, by providing the stopper 11 for intersections of the outermost periphery and the second row lying inside the outermost periphery, the contamination of regions lying inside the stopper 11 disposed at the intersections of the second row can be prevented.

Consequently, as the semiconductor wafer 50 shown in FIG. 25, by disposing a stopper 11a at the intersections of the outermost periphery and a stopper 11b at the intersections of the second row lying inside the outermost periphery, among intersections of respective scribe lines, the arrangement of the stopper 11 can be omitted in regions lying inside the second row. In other words, in Embodiment 2, the stopper 11 is disposed at corners of the ineffective chip region at the outer periphery of the semiconductor wafer 50, and no stopper 11 is disposed in the effective chip region lying inside the ineffective chip region.

Thus, in such embodiments, it is possible to reduce the amount of the stopper 11 to be formed in the scribe region 1b as compared with the layout of the stopper 11 shown in FIG. 7, and, therefore, to reduce the load on the dicing blade 40 (see FIG. 22) in the dicing process explained in Embodiment 1.

Furthermore, in Embodiment 2, since no stopper 11 is formed in the effective chip region, at intersections lying inside the intersections of the second row, each part of the insulating layer 9 and insulating layer 3 is removed to form a trench 1c. Consequently, as compared with the semiconductor wafer 20 shown in FIG. 7, the load on the dicing blade 40 (see FIG. 22) in the dicing process explained in Embodiment 1 can be reduced.

Accordingly, according to Embodiment 2, the occurrence of dicing failure caused by the damage of the dicing blade 40 (see FIG. 22) can be prevented more effectively than in Embodiment 1.

However, in the case of the semiconductor wafer 50 shown in FIG. 25, when a gap occurs between a part of the stopper 11 (either one of stopper 11a and stopper 11b, or the both) and the protective sheet 30 in the process of sticking the protective sheet 30 (see FIG. 18) explained in Embodiment 1, contamination may spread into the effective chip region. Accordingly, it is preferable to dispose the stopper 11 also at the corners of the effective chip region as explained in Embodiment 1, to prevent the contamination of the effective chip region.

In the case of the modified example shown in FIG. 25, when the metal pattern 10 (see FIG. 9) is patterned, or when the trench or the opening is formed in the insulating layer 9 etc., the formation of different patterns is required in the ineffective chip region and the effective chip region. Accordingly, the regular patterning without distinguishing the ineffective chip region from the effective chip region as explained in Embodiment 1 is preferable, from the standpoint of forming effectively the metal pattern 10, trench 1c etc. by setting the same patterning in the effective chip region and the ineffective chip region.

Embodiment 3

Figure 26:
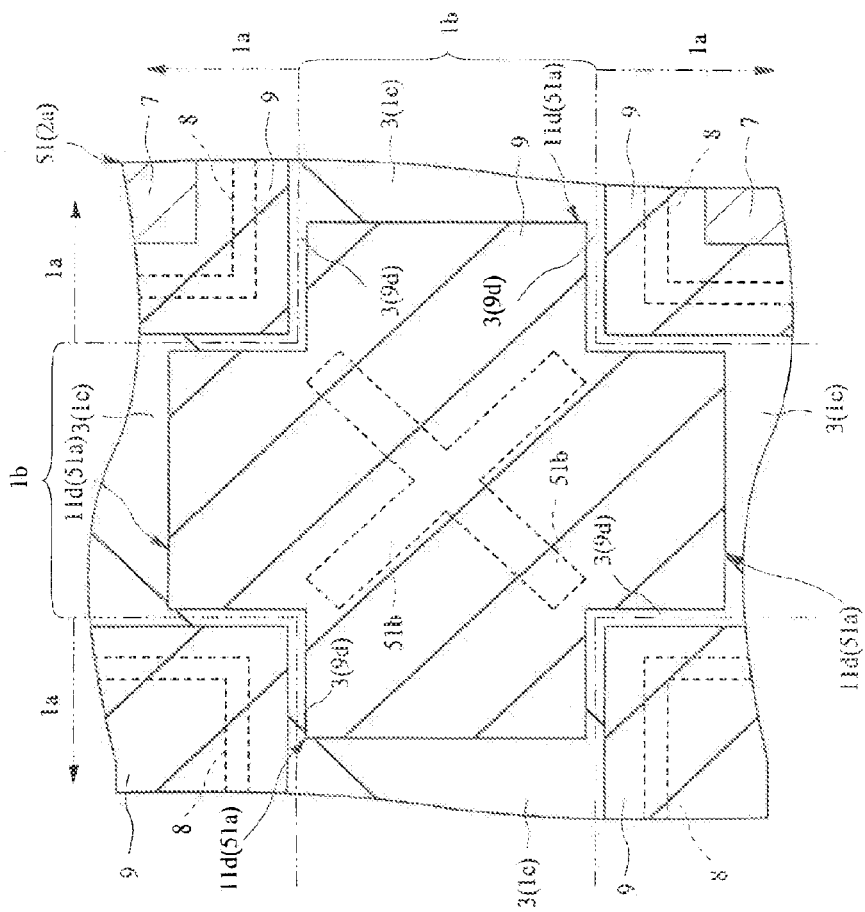
FIG. 26 is an enlarged plan view showing a part of a semiconductor wafer being a first modified example of the semiconductor wafer shown in FIG. 9.
Figure 27:
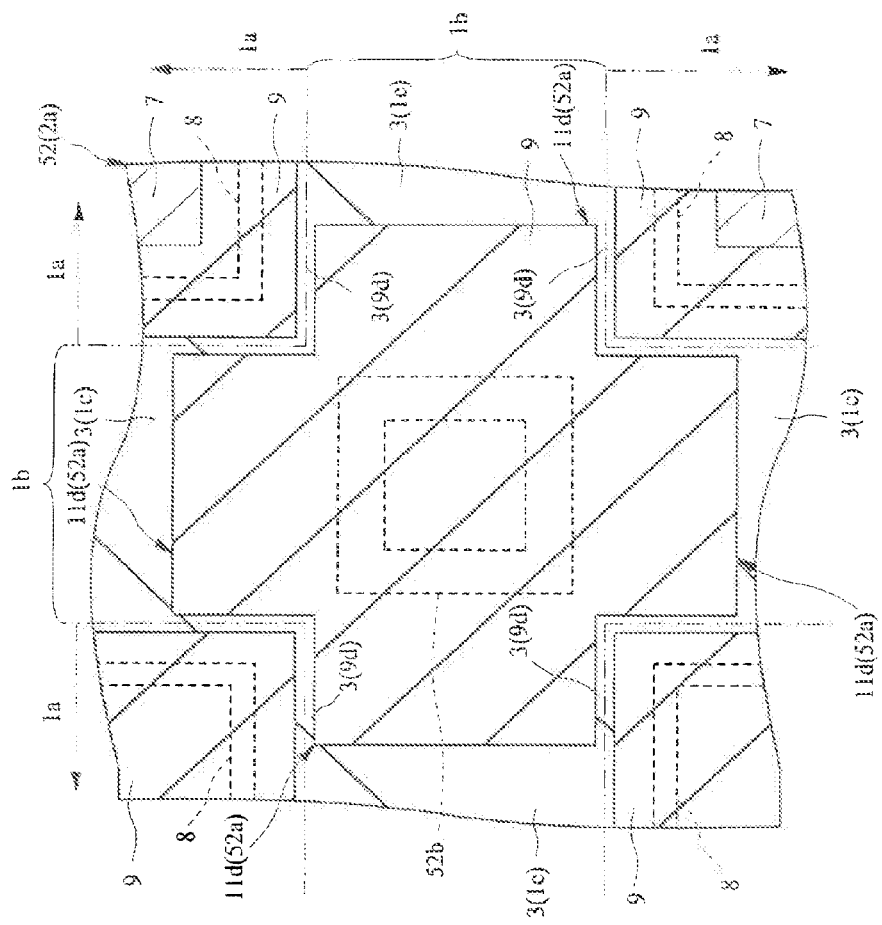
FIG. 27 is an enlarged plan view showing a part of a semiconductor wafer being a second modified example of the semiconductor wafer shown in FIG. 9.
Figure 28:
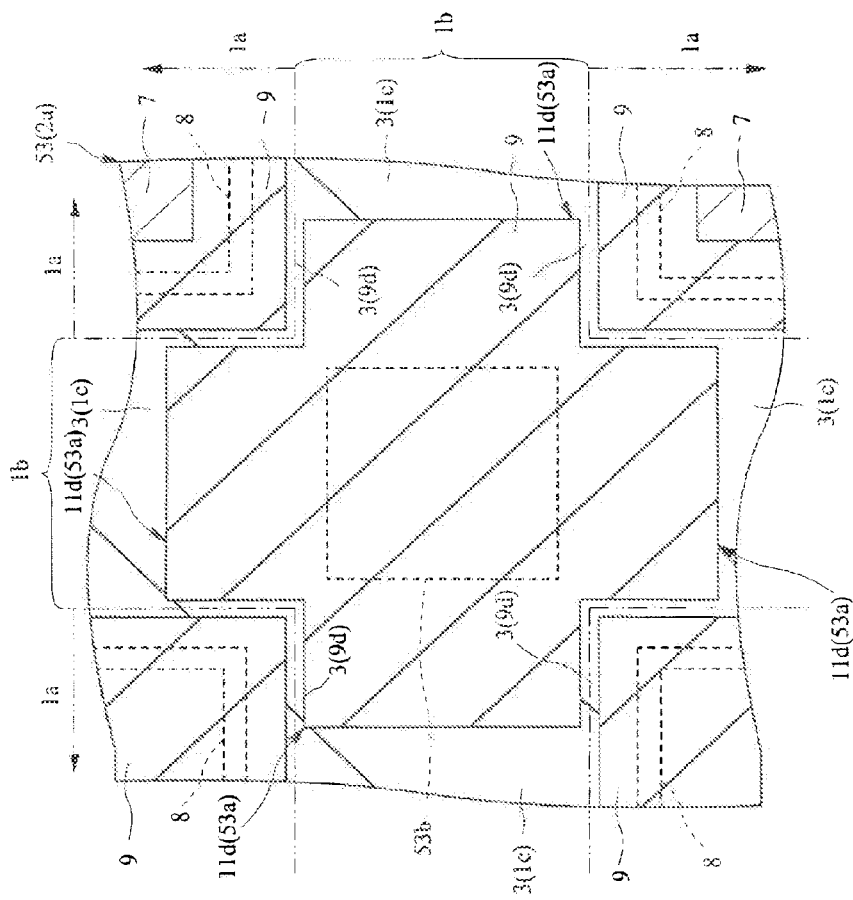
FIG. 28 is an enlarged plan view showing a part of a semiconductor wafer being a third modified example of the semiconductor wafer shown in FIG. 9.
Figure 29:
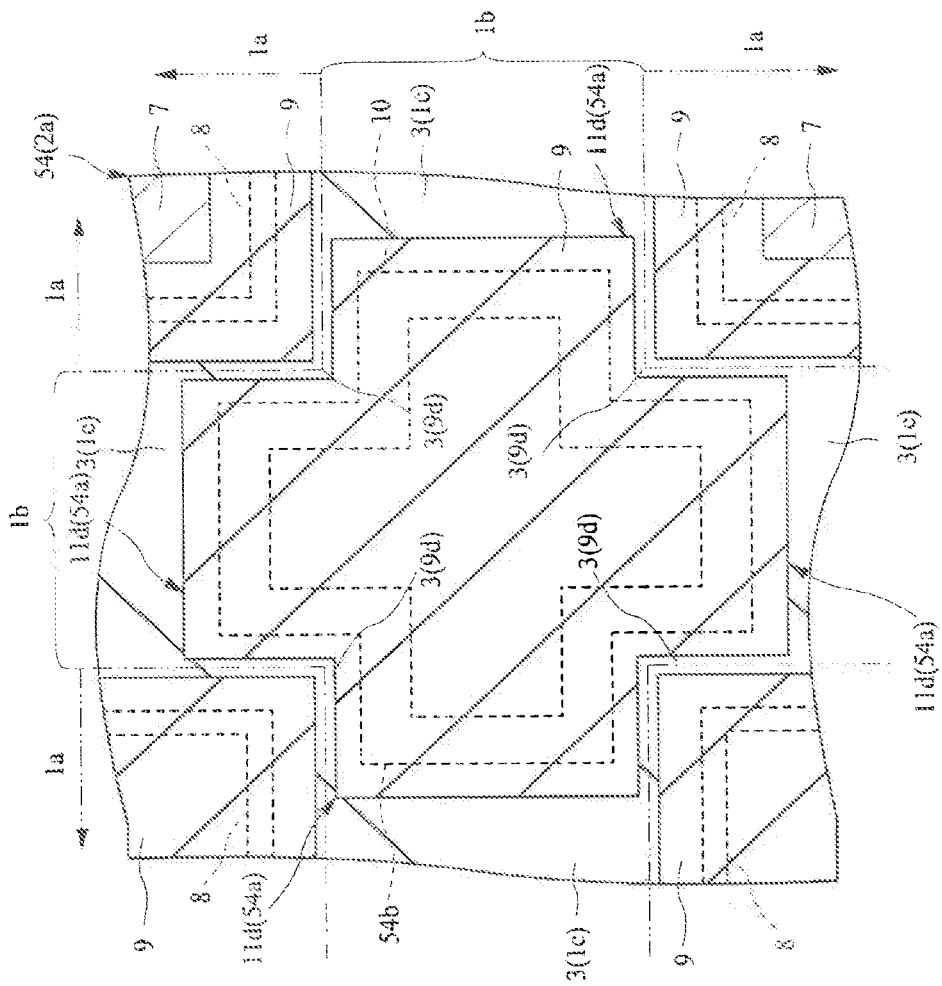
FIG. 29 is an enlarged plan view showing a part of a semiconductor wafer being a fourth modified example of the semiconductor wafer shown in FIG. 9.

In Embodiment 1, plural (four) metal patterns 10 are formed for the wiring layer 5c regarding the structure of the stopper 11 over the principal surface 2a of the semiconductor wafer 20. In Embodiment 3, a modified example of the metal pattern to be formed for the stopper 11 is described. FIG. 26 is an enlarged plan view showing a part of a semiconductor wafer being a first modified example of the semiconductor wafer shown in FIG. 9. FIG. 27 is an enlarged plan view showing a part of a semiconductor wafer being a second modified example of the semiconductor wafer shown in FIG. 9. FIG. 28 is an enlarged plan view showing apart of a semiconductor wafer being a third modified example of the semiconductor wafer shown in FIG. 9. FIG. 29 is an enlarged plan view showing a part of a semiconductor wafer being a fourth modified example of the semiconductor wafer shown in FIG. 9. Meanwhile, semiconductor wafers 51, 52, 53 and 54 of Embodiment 3 shown in FIGS. 26 to 29 are substantially the same as that in Embodiment 1 except for the planar shape of metal patterns 51b, 52b, 53b and 54b formed for stoppers 51a, 52a, 53a and 54a, respectively. Accordingly, overlapping explanations are omitted with respect to FIGS. 1 to 23 explained in Embodiment 1, or FIG. 25 explained in Embodiment 2. Although FIGS. 26 to 29 are plan views, for making the planar shape of respective insulating layer, metal pattern etc. to be laminated on the principal surface 2a to be easily understood, hatching is shown, and the profile of the guard ring 8 and the metal patterns 51b, 52b, 53b and 54b arranged under the insulating layer 9 is shown with a dotted line.

Between the semiconductor wafers 51, 52, 53 and 54 of Embodiment 3 shown in FIGS. 26 to 29 and the semiconductor wafer 20 described in Embodiment 1, a difference is the planar shape of metal patterns 51b, 52b, 53b and 54b formed for stoppers 51a, 52a, 53a and 54a. Moreover, due to the difference in the planar shape, the shape of the rising part of the insulating layer 9 covering the metal patterns 51b, 52b, 53b and 54b differs from that in Embodiment 1. However, other points are the same. For example, each of the metal patterns 51b, 52b, 53b and 54b is formed for the uppermost wiring layer, that is, the wiring layer 5c shown in FIG. 10, and, in this point, it is the same as the metal pattern 10 shown in FIG. 9. To the layout of respective stoppers 51a, 52a, 53a and 54a, the embodiment described in Embodiment 1 or in Embodiment 2 is also applicable here. Therefore, overlapping explanation is omitted. Hereinafter, the planar shape of the metal patterns 51b, 52b, 53b and 54b will now be described, respectively.

First, with respect to stopper 51a of the semiconductor wafer 51 being the first modified example shown in FIG. 26, two metal patterns 51b are arranged so as to intersect each other along diagonal lines of device regions 1a that are arranged in a matrix shape and have a tetragonal outline shape (see FIG. 8), respectively. The entire upper surface (surface) of the metal pattern 51b is covered by the insulating layer 9.

When carrying out the process of grinding the back surface explained in Embodiment 1 using the semiconductor wafer 51, the protective sheet 30 (see FIG. 21) can be contacted closely to the insulating layer 9 covering the metal pattern 51b. Therefore, the space formed between the protective sheet 30 and the stopper 51a can be made smaller as compared with that in semiconductor wafers 70 and 71 of the Comparative Examples shown in FIG. 32 or 33.

However, since the metal pattern 51b is arranged to be inside intersections of the scribe lines (scribe regions 1b), it has a longer interval from the guard ring 8 as compared with the metal pattern 10 of Embodiment 1. Accordingly, the metal pattern 10 of Embodiment 1 is more preferable from the standpoint of obtaining the sealing effect as explained with respect to Embodiment 1 by making the cross-sectional area of the space 36 shown in FIG. 21 smaller.

Meanwhile, from the standpoint of preventing the occurrence of dicing failure in the dicing process as explained in Embodiment 1 by reducing the amount of metal patterns containing, for example, aluminum, approximately the same effect can be obtained as compared with the metal pattern 10 as described with respect to Embodiment 1.

Next, for the stopper 52a of a semiconductor wafer 52 being the second modified example shown in FIG. 27, metal patterns 52b having a planar shape of a tetragonal frame are arranged along the profile of the intersections inside the intersections of the scribe lines. The entire upper surface (surface) of the metal pattern 52b is covered by the insulating layer 9.

When carrying out the process of grinding the back surface as explained with respect to Embodiment 1 using the semiconductor wafer 52, the protective sheet 30 (see FIG. 21) can be contacted closely to the insulating layer 9 covering the metal pattern 52b. Therefore, the space formed between the protective sheet 30 and the stopper 52a can be made smaller as compared with that in semiconductor wafers 70 and 71 of the Comparative Examples shown in FIG. 32 or 33.

However, since the metal pattern 52b is arranged to be inside intersections of the scribe lines (scribe regions 1b), it has a longer interval from the guard ring 8 as compared with the metal pattern 10 of Embodiment 1. Accordingly, the metal pattern 10 of Embodiment 1 is more preferable from the standpoint of obtaining surely the sealing effect as described with respect to Embodiment 1 by making the cross-sectional area of the space 36 shown in FIG. 21 smaller.

Meanwhile, from the standpoint of preventing the occurrence of dicing failure in the dicing process as explained with respect to Embodiment 1 by reducing the amount of metal patterns, approximately the same effect, or a less preferable effect can be obtained as compared with the metal pattern 10 as explained with respect to Embodiment 1. The length of the side extending in the direction along the scribe line is longer in the metal pattern 52b than in the metal pattern 10 as described with respect to Embodiment 1. Accordingly, when the dicing blade 40 (see FIG. 22) does not cut the side extending along the extending direction of the scribe line in the dicing process, the same effect as that described for Embodiment 1 can be obtained. On the other hand, when the dicing blade 40 (see FIG. 22) cuts the side extending along the extending direction of the scribe line, the embodiment of Embodiment 1 has better suppression of clogging of the dicing blade 40.

Next, to the stopper 53a of the semiconductor wafer 53 being the third modified example shown in FIG. 28, metal patterns 53b having a tetragonal planar shape are arranged along the profile of the intersections inside the intersections of the scribe lines. The entire upper surface (surface) of the metal pattern 53b is covered by the insulating layer 9.

When carrying out the process of grinding the back surface discussed with respect to Embodiment 1 using the semiconductor wafer 53, the protective sheet 30 (see FIG. 21) can be contacted closely to the insulating layer 9 covering the metal pattern 53b. Therefore, the space formed between the protective sheet 30 and the stopper 53a can be made smaller as compared with that in semiconductor wafers 70 and 71 of the Comparative Examples shown in FIG. 32 or 33.

Moreover, in the case of the stopper 53a, the close-contact area between the insulating layer 9 covering the metal pattern 53b and the protective sheet 30 increases as compared with the case of the stopper 11 discussed with respect to Embodiment 1, which is more preferable from the standpoint of maintaining the sealing effect as explained with respect to Embodiment 1.

However, since the metal pattern 53b is arranged to be inside the intersections of the scribe lines (scribe regions 1b), the interval from the guard ring 8 is longer than that of the metal pattern 10 described for Embodiment 1. Accordingly, from the standpoint of obtaining the sealing effect explained in Embodiment 1 by making the cross-sectional area of the space 36 shown in FIG. 21 smaller, the metal pattern 10 explained in Embodiment 1 is more preferable.

Moreover, from the standpoint of preventing the occurrence of dicing failure in the dicing process by reducing the amount of metal patterns, the embodiment described with respect to Embodiment 1 is more preferable, because the metal pattern 53b has a larger horizontal area of metal to be cut than the metal pattern 10 discussed for Embodiment 1.

Meanwhile, since the metal pattern 53b shown in FIG. 28 has a larger horizontal area as compared with the metal pattern 52b shown in FIG. 27, when at least the entire outer periphery of the metal pattern 53b is covered by the insulating layer 9, a sealing effect comparable with that of the stopper 52a shown in FIG. 27 can be obtained. For example, the central region of the metal pattern 53b may not be covered by the insulating layer 9. However, for increasing the close-contact area with the protective sheet 30 (see FIG. 21) to maintain the sealing effect, preferably the entire metal pattern 53b is covered by the insulating layer 9.

In the stoppers 51a, 52a and 53a shown in FIGS. 26 to 28, each of the metal patterns 51b, 52b and 53b is arranged to be inside the intersections. Accordingly, from the standpoint of providing a space for arranging the metal patterns 51b, 52b and 53b, projections 11d each projecting from the intersection of the scribe lines in the extended direction of respective scribe lines may not be formed, differing from the stopper 11 (see FIG. 9) as described for the above embodiment. However, for each of the stoppers 51a, 52a and 53a, the projection 11d is formed. The stoppers 51a, 52a and 53a formed by arranging the metal patterns 51b, 52b and 53b inside the intersections as described above also enable the sealing effect to be obtained by forming the projection 11d. Because it is possible to set the interval of the pathway leading to the space where the trench 1c (see FIG. 9) is formed to be longer, the space being arranged inside a narrow space formed between the metal patterns 51b, 52b and 53b and the guard ring 8, as explained with respect to Embodiment 1.

Next, regarding the stopper 54a of the semiconductor wafer 54 being the fourth modified example shown in FIG. 29, the metal pattern 54b having a frame-like planar shape along the profile of the scribe line is arranged. Although the metal pattern 54b has a frame-like shape as is the case for the metal pattern 52b shown in FIG. 27, the external shape here is not a tetragon. However, it has a shape that portions project from the intersection of the scribe lines towards the extended direction of respective scribe lines. That is, it is a shape formed by projecting the metal pattern 52b shown in FIG. 27 toward the extended directions of respective scribe lines. In other words, it is a shape formed by coupling the plural metal patterns 10 shown in FIG. 9 along the profile of the scribe region 1b to be combined. The entire upper surface (surface) of the metal pattern 54b is covered by the insulating layer 9.

When the semiconductor wafer 54 is used to carry out the process of grinding the back surface as discussed with respect to Embodiment 1, it is possible to contact closely the insulating layer 9 covering the metal pattern 54b to the protective sheet 30 (see FIG. 21), and thus to make the space formed between the protective sheet 30 and the stopper 54a smaller as compared with that of the semiconductor wafers 70 and 71 of the Comparative Example shown in FIG. 32 or 33.

Moreover, in the case of the stopper 54a, the close-contact area between the insulating layer 9 covering the metal pattern 54b and the protective sheet 30 increases as compared with the case of the stopper 11 described with respect to Embodiment 1, which is more preferable for maintaining the sealing effect explained with respect to Embodiment 1.

Furthermore, in the case of the stopper 54a, since the metal pattern 54b is arranged to have projection 11d outside the intersection, the interval from the guard ring 8 to the metal pattern 54b is comparable to that of the stopper 11 described with respect to Embodiment 1. Accordingly, a space having a cross-sectional area comparable to that of the space 36 shown in FIG. 21 is formed. Moreover, since the metal pattern 54b formed at respective projections 11d is formed in a body with no break, it is thus formed further inside the semiconductor wafer 54 than the space 36 (see FIG. 21) to enable the volume of the space adjacent to (leading to) the space 36 to be smaller. Consequently, the sealing effect may be obtained more easily as compared to the stopper 11 described with respect to Embodiment 1.

However, from the standpoint of preventing the occurrence of dicing failure in the dicing process by reducing the amount of the metal pattern, it provides a comparable effect with that of stopper 52a explained in FIG. 27, because the length of the side extending along the extended direction of the scribe line is longer than that of the metal pattern 10, described with respect to Embodiment 1.

Thus, particular embodiments of the present invention have been described. However, the present invention is not to be restricted to the disclosed embodiments, as changes are possible within its spirit and scope.

Figure 30:
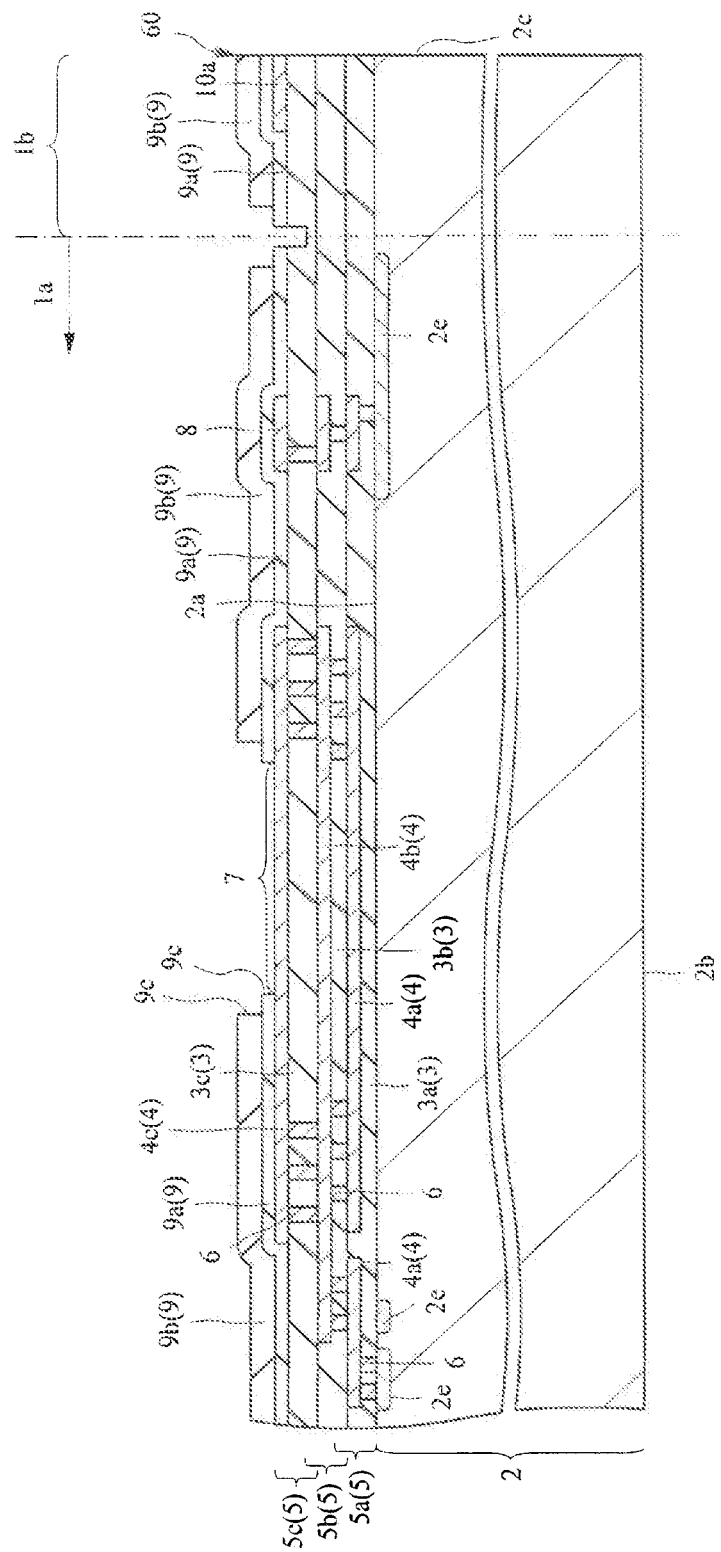
FIG. 30 is an enlarged cross-sectional view of a semiconductor chip being a modified example of the semiconductor chip shown in FIG. 3.

For example, in Embodiments 1, 2 and 3, as to the laminated structure of the wiring layer of the semiconductor chip 1, embodiments were described in which the laminate is obtained by forming the insulating layer 3, embedding the via 6 passing through the insulating layer 3, and, after that, the wiring 4 is formed over the insulating layer 3, as shown in FIG. 3, and by repeating the cycle sequentially. However, other embodiments of the laminated structure of the wiring layer are possible. For example, as shown in FIG. 30, which is an enlarged cross-sectional view of a semiconductor chip being a modified example of the semiconductor chip shown in FIG. 3, embodiments can also be applied to an embedded wiring structure in which wirings 4a and 4b of respective wiring layers 5a and 5b are embedded into the insulating layers 3a and 3b. Embedding of the wiring 4 into the insulating layer 3 as shown in FIG. 30 is referred to as the dual damascene process. In the semiconductor chip 60 shown in FIG. 30, the wirings 4a and 4b, and via 6 embedded into the insulating layer 3 contain copper (Cu), and the wiring 4c arranged to the uppermost wiring layer 5c contains, for example, aluminum. Further, the wiring 4c of the uppermost layer is not embedded into the insulating layer 3c, but rather is formed over the insulating layer 3c. Since the wiring 4c of the uppermost layer is formed over the insulating layer 3c as described above, the top of the insulating layer 3c is not flat, but rather has roughness as is the case for the semiconductor chip 1 described with respect to Embodiment 1. Accordingly, the insulating layer 9 formed so as to cover the wiring 4c has roughness following the arrangement of the wiring 4c etc. Therefore, embodiments as discussed with respect to Embodiments 1, 2 and 3 can be applied.

Moreover, for example, in Embodiment 1, an embodiment in which the semiconductor wafer 20 is cut from the principal surface 2a side to the back surface 2b by the dicing blade 40, was explained as the dicing process. However, other dicing methods can be used. For example, a step dicing method, in which the semiconductor wafer 20 is cut with a first dicing blade having a first width from the principal surface 2a side to the middle thereof, and, after that, the remaining part is cut with a second dicing blade having a second width narrower than the first width to the back surface 2b to be separated. The step dicing method has an advantage that the stress applied to the semiconductor wafer 20 can be reduced in the dicing process to suppress the damage of the semiconductor chip. Semiconductor chips obtained by the dicing according to the step dicing method have a shape in which a step part or a taper part is formed along the outer periphery of the principal surface side.

For example, in Embodiment 2, another embodiment regarding the arrangement of the stopper 11 over the principal surface of the semiconductor wafer was described. However, other embodiments are possible. For example, according to the examination of the inventors of the present invention, the arrangement of the stopper 11 at least at the intersections of the outermost periphery can reduce the penetration of the grinding liquid 35 (see FIG. 20). Accordingly, when the stopper 11 is disposed to be at least at the intersections of the outermost periphery, the contamination of the effective chip region can be suppressed as compared with the semiconductor wafer of the Comparative Example shown in FIGS. 31, 32 and 33 as explained with respect to Embodiment 1.

For example, in embodiment 3, an embodiment in which the planar shape of the metal pattern formed for the stopper was described. However, the planar shape of the metal pattern may be applied while combining Embodiment 1 and Embodiment 3.

The present invention is utilizable for semiconductor devices of a thin type formed by grinding the back surface of the semiconductor device.

What is claimed is:
1. A manufacturing method of a semiconductor device, comprising the steps of:
  (a) providing a semiconductor wafer having a principal surface, a back surface opposite the principal surface, a plurality of device regions formed on the principal surface, and a scribe region disposed between the device regions;
  (b) supplying a grinding fluid and grinding the back surface of the semiconductor wafer on which a protective sheet covering the principal surface is stuck to the principal surface of the semiconductor wafer; and
  (c) after the step (b), cutting the semiconductor wafer by running a dicing blade along the scribe region to divide the semiconductor wafer into a plurality of chips each having a respective device region,
  wherein the device regions of the semiconductor wafer each include a plurality of semiconductor elements formed on the principal surface, a first insulating layer formed so as to cover the semiconductor elements, an uppermost wiring layer formed over the first insulating layer, a plurality of terminals formed at a same layer of the uppermost wiring layer and electrically coupled to the semiconductor elements, and a second insulating layer formed so as to cover the uppermost wiring layer and having a plurality of openings exposing the terminals, respectively,
  wherein in a part of the scribe region of the semiconductor wafer, the first insulating layer is formed over the principal surface, a first metal pattern is formed at the same layer of the uppermost wiring layer, and the second insulating layer in the scribe region covers an entire upper surface of the first metal pattern,
  wherein the second insulating layer in the device region and the second insulating layer in the scribe region are separated in a plan view, and
  wherein the step (b) is carried out after sticking the protective sheet to the second insulating layer.
2. The manufacturing method of a semiconductor device according to claim 1, further comprising:
  forming a plurality of wiring layers between the principal surface and the uppermost wiring layer, and
  forming, in each of the device regions of the semiconductor wafer, a second metal pattern by connecting respective wiring layers from the principal surface to the uppermost wiring layer so as to surround a region in which the terminals are formed,
  wherein the second insulating layer is formed over the second metal pattern so as to cover the upper surface of the second metal pattern, and
  wherein the first metal pattern and the second metal pattern are spaced apart from each other.
3. The manufacturing method of a semiconductor device according to claim 2, further comprising:
  forming a trench between the second insulating layer formed for the device region and the second insulating layer formed for the scribe region,
  wherein the second insulating layer of the device region is separated from the second insulating layer of the scribe region.
4. The manufacturing method of a semiconductor device according to claim 3,
  wherein an interval from an end of the trench on a scribe region side to an end of the first metal pattern is shorter than an interval from an end of the trench on a device region side to an end of the second metal pattern.
5. The manufacturing method of a semiconductor device according to claim 3,
  wherein the second metal pattern is adapted to receive a reference potential.
6. The manufacturing method of a semiconductor device according to claim 1,
  wherein the scribe region has a plurality of first scribe lines extending along a row direction and a plurality of second scribe lines extending along a column direction, wherein the first metal pattern has a rectangular planar shape, and wherein a short side of the first metal pattern is disposed along a direction extending along the first or second scribe line.

7. The manufacturing method of a semiconductor device according to claim 1, further comprising:

forming a trench by removing a part of the second insulating layer and a part of the first insulating layer, wherein the scribe region has a plurality of first scribe lines extending along a row direction and a plurality of second scribe lines extending along a column direction, and wherein said trench is formed between a plurality of intersections between the first scribe lines and the second scribe lines.

8. The manufacturing method of a semiconductor device according to claim 1, wherein the scribe region has a plurality of first scribe lines extending along a row direction and a plurality of second scribe lines extending along a column direction, and wherein the first metal pattern is disposed at intersections between the first scribe lines and the second scribe lines.

9. The manufacturing method of a semiconductor device according to claim 8, wherein each of the first metal patterns is disposed between adjacent device regions among the device regions arranged in a matrix.

10. The manufacturing method of a semiconductor device according to claim 1, further comprising:

forming, in another part of the scribe region of the semiconductor wafer, the first insulating layer formed over the principal surface, a third metal pattern formed for the uppermost wiring layer and electrically coupled to a semiconductor element formed for the principal surface of the scribe region via a wiring layer under the uppermost wiring layer, and the second insulating layer covering an outer periphery of the third metal pattern so as to expose a part of the third metal pattern, wherein an area of the first metal pattern is smaller than that of the third metal pattern.

11. The manufacturing method of a semiconductor device according to claim 1, further comprising:

forming, in another part of the scribe region of the semiconductor wafer, the first insulating layer formed over the principal surface, a third metal pattern formed for the uppermost wiring layer and having a rectangular planar shape, wherein the second insulating layer covers the first insulating layer so as to expose at least a part of the third metal pattern, and forming an opening over the third metal pattern by removing the second insulating layer so as to expose ends of the third metal pattern.

* * * * *